(12) United States Patent
Kawahito et al.

(10) Patent No.: US 7,910,964 B2
(45) Date of Patent: *Mar. 22, 2011

(54) SEMICONDUCTOR RANGE-FINDING ELEMENT AND SOLID-STATE IMAGING DEVICE

(75) Inventors: Shoji Kawahito, Hamamatsu (JP); Mitsuru Homma, Fukuyama (JP)

(73) Assignees: National University Corporation Shizuoka University, Shizuoka-shi (JP); Sharp Kabushiki Kaisha, Osaka-shi (JP)

( * ) Notice: Subject to any disclaimer, the term of this patent is extended or adjusted under 35 U.S.C. 154(b) by 408 days.

This patent is subject to a terminal disclaimer.

(21) Appl. No.: 12/065,158

(22) PCT Filed: Aug. 30, 2006

(86) PCT No.: PCT/JP2006/317129
§ 371 (c)(1),
(2), (4) Date: Feb. 28, 2008

(87) PCT Pub. No.: WO2007/026777
PCT Pub. Date: Mar. 8, 2007

(65) Prior Publication Data
US 2009/0230437 A1     Sep. 17, 2009

(30) Foreign Application Priority Data
Aug. 30, 2005   (JP) ................................. 2005-250297

(51) Int. Cl.
| | |
|---|---|
| H01L 31/062 | (2006.01) |
| H01L 31/113 | (2006.01) |
| H01L 29/768 | (2006.01) |
| H01L 27/148 | (2006.01) |

(52) U.S. Cl. ........ 257/292; 257/221; 257/222; 257/225; 257/226; 257/227; 257/228; 257/229; 257/231; 257/E27.133; 257/E27.15; 257/E27.151; 257/E27.152

(58) Field of Classification Search .......... 257/221–222, 257/225–229, 231, E27.15–E27.152
See application file for complete search history.

(56) References Cited

U.S. PATENT DOCUMENTS
7,464,351 B2 * 12/2008 Bamji et al. ..................... 716/5
(Continued)

FOREIGN PATENT DOCUMENTS
JP          4 211180          8/1992
(Continued)

OTHER PUBLICATIONS

Sawada, Tomonari et al., "A QVGA-Size CMOS Time-of-Flight Range Image Sensor With Background Light Charge Draining Structure", ITE Technical Report, vol. 30, No. 25, pp. 13 to 17, 2006. (with English abstract).

(Continued)

*Primary Examiner* — Zandra Smith
*Assistant Examiner* — Jeremy J Joy
(74) *Attorney, Agent, or Firm* — Oblon, Spivak, McClelland, Maier & Neustadt, L.L.P.

(57) ABSTRACT

A part of a semiconductor layer directly under a light-receiving gate electrode functions as a charge generation region, and electrons generated in the charge generation region are injected into a part of a surface buried region directly above the charge generation region. The surface buried region directly under a first transfer gate electrode functions as a first transfer channel, and the surface buried region directly under a second transfer gate electrode functions as a second transfer channel. Signal charges are alternately transferred to an n-type first floating drain region and a second floating drain region through the first and second floating transfer channels.

28 Claims, 16 Drawing Sheets

U.S. PATENT DOCUMENTS

| | | | |
|---|---|---|---|
| 7,671,391 B2 * | 3/2010 | Kawahito | 257/290 |
| 2003/0223053 A1 * | 12/2003 | Liu et al. | 356/5.1 |
| 2006/0128087 A1 * | 6/2006 | Bamji et al. | 438/199 |
| 2006/0192938 A1 | 8/2006 | Kawahito | |
| 2007/0103569 A1 | 5/2007 | Kawahito | |
| 2007/0158770 A1 * | 7/2007 | Kawahito | 257/431 |
| 2007/0176213 A1 * | 8/2007 | Oda | 257/247 |
| 2008/0277700 A1 | 11/2008 | Kawahito | |
| 2009/0114919 A1 * | 5/2009 | Kawahito et al. | 257/59 |
| 2009/0134396 A1 * | 5/2009 | Kawahito et al. | 257/72 |
| 2009/0230437 A1 * | 9/2009 | Kawahito et al. | 257/226 |
| 2010/0073541 A1 | 3/2010 | Kawahito | |

FOREIGN PATENT DOCUMENTS

| | | | |
|---|---|---|---|
| JP | 2001 194458 | | 7/2001 |
| JP | 2001 326378 | | 11/2001 |
| JP | 2002 368205 | | 12/2002 |
| JP | 2002368205 A | * | 12/2002 |
| JP | 2004 294420 | | 10/2004 |
| WO | 2005 078386 | | 8/2005 |
| WO | WO 2005078386 A1 | * | 8/2005 |

OTHER PUBLICATIONS

Izhal, A. H. et al., "A CMOS Time-of-Flight Range Image Sensor With Gates on Field Oxide Structure", IEEE Sensors, pp. 141 to 144, 2005.

Miyagawa, Ryohei et al., "CCD-Based Range-Finging Sensor", IEEE Transactions on Electron Devices, vol. 44, No. 10, pp. 1648 to 1652, 1997.

* cited by examiner

FIG. 9
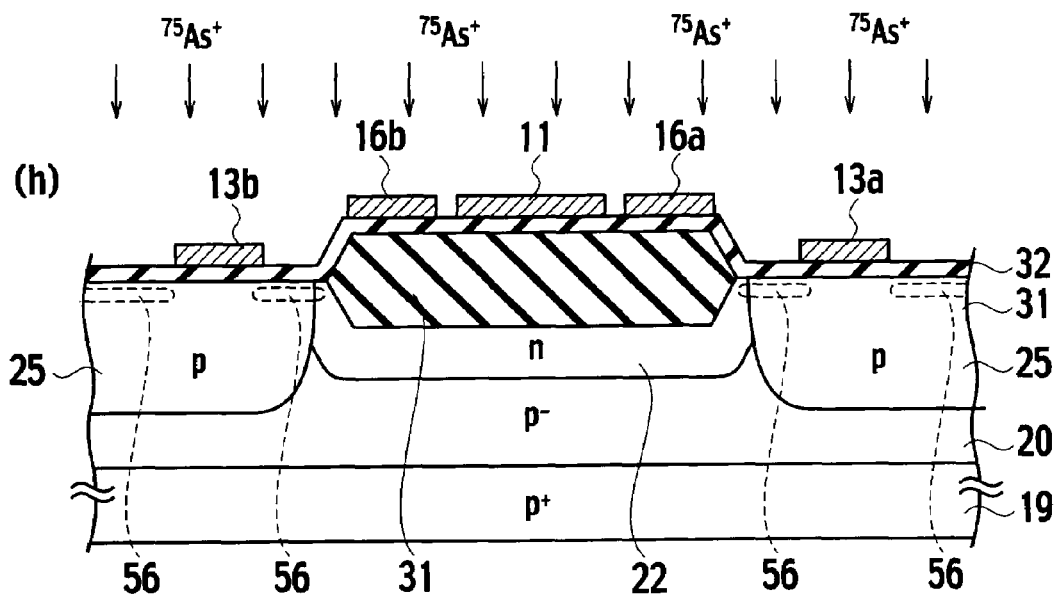
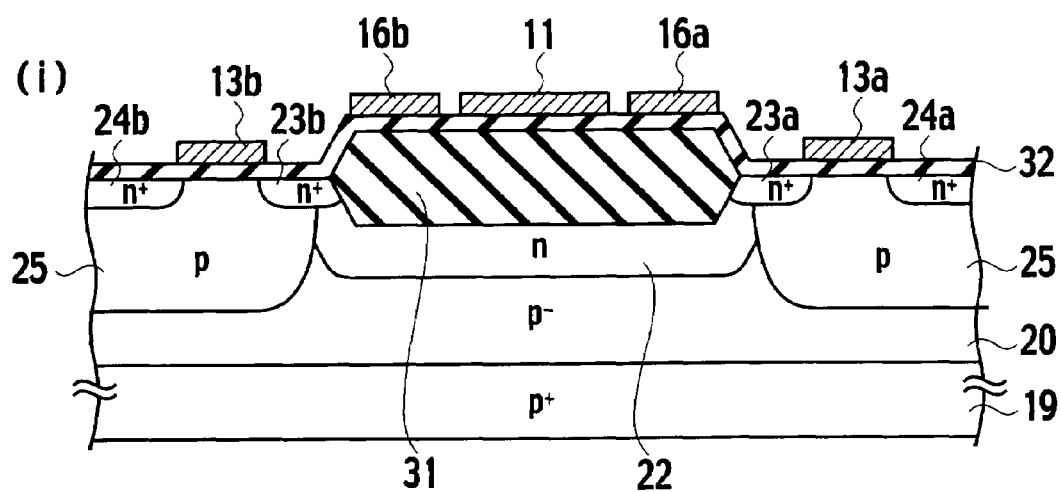

SEMICONDUCTOR RANGE-FINDING ELEMENT AND SOLID-STATE IMAGING DEVICE

FIELD OF THE INVENTION

The present invention relates to a semiconductor range-finding element and a solid-state imaging device in which a plurality of semiconductor range-finding elements are arrayed.

DESCRIPTION OF THE RELATED ART

As reported by R. Miyagawa et al., "CCD-Based Range-Finding Sensor", IEEE Transaction on Electron Devices, October 1997, Vol. 44, No. 10, p. 1648-1652, with a pioneering report of one-dimensional CCD range-finding sensor, which has been firstly reported in 1997, the development of time-of-flight (TOF) type range-finding sensors using time-of-flight of light and obtaining range images are advancing in many fields.

However, the resolution of the currently-available TOF range-finding sensor remains within about 20,000 pixels. Also, in the case of using the CCD, as the number of the pixels is increased, it becomes difficult to drive the pixels. In the hybrid method of combining CMOS manufacturing process and CCD manufacturing process, its manufacturing cost becomes expensive.

On the other hand, as described in Japanese Laid Open Patent Application (JP 2004-294420A), the entire contents of which are incorporated by reference in this specification, one of the inventors has already proposed the method that is effective for a higher sensitivity and based on a CMOS technique for carrying out a charge transfer at a high speed.

Japanese Laid Open Patent Application (JP 2002-368205A) proposes a TOF range-finding sensor, encompassing a p-type impurity region formed on an n-type substrate, having an impurity concentration of about $2 \times 10^{15}$ cm$^{-3}$ serving as a photoelectric converting region and a couple of p-type impurity regions formed on the n-type substrate, having an impurity concentration between about $2 \times 10^{16}$ cm$^{-3}$ and $2 \times 10^{17}$ cm$^{-3}$, sandwiching the photoelectric converting region. The TOF range-finding sensor is designed such that, by adjusting the impurity concentration of the photoelectric converting region, a photoelectric conversion depth is arbitrarily set to achieve a high sensibility. An object of the TOF range-finding sensor described in JP 2002-368205A lies in the mechanism that the photoelectric converting region is formed on the n-type substrate, and the electrons generated in the deep region in the photoelectric converting region are absorbed by a substrate electrode, and "a charge-crosstalk" is reduced. Moreover, the TOF range-finding sensor described in JP 2002-368205A proposes the structure in which a couple of n-type impurity regions are formed near each center of two divided transfer switching means, an impurity concentration of each of the n-type impurity regions is selected to be between about $2 \times 10^{15}$ cm$^{-3}$ and $5 \times 10^{17}$ cm$^{-3}$ so that the n-type impurity regions can be depleted perfectly at an operational voltage. Thereby generating electric fields caused by built-in potentials in the n-type impurity regions, near the center of the transfer switching means, where the effect of a fringing electric field is smallest, so that the transfer velocity can be made high, thereby reducing the charge-transfer crosstalk.

However, the earlier TOF range-finding sensor has a performance that should be improved in view of a distance resolution and a space resolution. Thus, the TOF range-finding sensor, which can be manufactured at lower cost, having a high distance resolution and a high space resolution is desired.

SUMMARY OF THE INVENTION

It is an object of the present invention to provide a semiconductor range-finding element in which a high speed charge transfer can be executed, and a solid-state imaging device implemented by the semiconductor range-finding elements, which can be manufactured at lower cost, having a high distance resolution and a high space resolution In order to achieve above-mentioned object, the first aspect of the present invention inheres in a semiconductor range-finding element, encompassing (a) a semiconductor photoelectric conversion element encompassing a charge generation region of a first conductivity type, and a part of a surface buried region of a second conductivity type of an opposite conductivity type to the first conductivity type disposed on the charge generation region, configured to receive an optical pulse, which is reflected by a target sample, and configured to converts the optical signal into signal charges in the charge generation region; (b) first and second transfer gate electrodes configured to electrostatically control potentials of first and second transfer channels implemented by another part of the surface buried region adjacent to the part of the surface buried region directly over the charge generation region, through insulating films formed on the first and second transfer channels, respectively, and configured to alternately transfer the signal charges through the first and second transfer channels; and (c) first and second floating drain regions configured to accumulate the signal charges transferred by the first and second transfer gate electrodes, sequentially and respectively, having the second conductivity type and a higher impurity concentration than the surface buried region. In accordance with the semiconductor range-finding element pertaining to the first aspect, by sequentially applying pulse signals to the first and second transfer gate electrodes in synchronization with the optical pulse so as to operate the first and second transfer gate electrodes, a range to the target sample is measured, in accordance with a distribution ratio between the charges accumulated in the first and second floating drain regions. Here, the first conductivity type and the second conductivity type are opposite to each other. That is, when the first conductivity type is n-type, the second conductivity type is p-type, and when the first conductivity type is the p-type, the second conductivity type is the n-type. As "the claimed insulating films", a silicon oxide film ($SiO_2$ film) is preferable. However, the use of various insulating films other than the silicon oxide film ($SiO_2$ film) is not inhibited. That is, the first and second transfer gate electrodes typically have the insulating gate structure of insulating gate type transistors (MIS transistors) having the various insulating films. For example, in a case of the ONO film implemented by the triple-layer composite film of silicon oxide film ($SiO_2$ film)/silicon nitride film ($Si_3N_4$ film)/silicon oxide film ($SiO_2$ film), a dielectric constant of approximately $\in_r$=5 to 5.5 is obtained. Moreover, the single layer film made of any one of a strontium oxide (SrO) film of $\in_r$=6, a silicon nitride ($Si_3N_4$) film of $\in_r$=7, an aluminum oxide ($Al_2O_3$) film of $\in_r$=8 to 11, a magnesium oxide (MgO) film of $\in_r$=10, a yttrium oxide ($Y_2O_3$) film of $\in_r$=16 to 17, a hafnium oxide ($HfO_2$) film of $\in_r$=22 to 23, a zirconium oxide ($ZrO_2$) film of $\in_r$=22 to 23, a tantalum oxide ($Ta_2O_5$) film of $\in_r$=25 to 27, and a bismuth oxide ($Bi_2O_3$) film of $\in_r$=40, or a composite film in which the plurality of foregoing materials are laminated can be used as the gate insulating film of the MIS transistor. $Ta_2O_5$ and $Bi_2O_3$ are poor in thermal stability on the interface with poly-crystal silicon. By the way, since the values of the exemplified respective dielectric constants $\in_r$ of those materials may be changed depending on respective manufacturing methods, the values of dielectric constants $\in_r$ may depart from above-mentioned values, depending on a case. Moreover, a composite gate insulating film embracing one of those films and a silicon oxide film may be used. The composite film may have a stacked structure of triple layers or more. That is, at least, the gate insulating film that partially includes the material having the foregoing dielectric constant $\in_r$ of 5 to 6 or more is preferred. However, in the case of the composite film, it is preferred to select the combination in which the effective dielectric constant $\in_{ref}$ measured as the entire gate insulating film is 5 to 6 or more. Also, the gate insulating film made of ternary-based compound such as a hafnium aluminate (HfAlO) film may be used. That is, the oxide, which at least includes any one element of strontium (Sr), Aluminum (Al), magnesium (Mg), yttrium (Y), hafnium (Hf), zirconium (Zr), tantalum (Ta) and bismuth (Bi), or the silicon nitride, which includes those elements, can be used as the gate insulating film. By the way, strontium titanate ($SrTiO_3$) of ferroelectric material, barium strontium titanate (BaSrTiO3) and the like can be used as the gate insulating film of a high dielectric constant. However, the lack of the thermal stability on the interface with the poly-crystal silicon and the hysteresis characteristic of the ferroelectric material are required to be considered.

The second aspect of the present invention inheres in a solid-state imaging device, having a plurality of pixels arrayed in a one-dimensional direction, wherein each of the pixels encompasses (a) a semiconductor photoelectric conversion element encompassing a charge generation region of a first conductivity type, and a part of a surface buried region of a second conductivity type of an opposite conductivity type to the first conductivity type on the charge generation region, configured to receive an optical pulse, which is reflected by a target sample, and to convert the optical signal into signal charges in the charge generation region; (b) first and second transfer gate electrodes configured to electrostatically control potentials of first and second transfer channels implemented by another part of the surface buried region adjacent to the part of the surface buried region directly over the charge generation region, through insulating films formed on the first and second transfer channels, respectively, and configured to alternately transfer the signal charges through the first and second transfer channels; and (c) first and second floating drain regions configured to accumulate the signal charges transferred by the first and second transfer gate electrodes, sequentially and respectively, having the second conductivity type and a higher impurity concentration than the surface buried region. In accordance with the solid-state imaging device pertaining to the second aspect, pulse signals are sequentially applied to the first and second transfer gate electrodes in all of the pixels, in synchronization with the optical pulse, and in each of the pixels, a range to the target sample is measured in accordance with a distribution ratio between the charges accumulated in the first and second floating drain regions.

The third aspect of the present invention inheres in a solid-state imaging device, having a plurality of pixels arrayed in a shape of a two-dimensional matrix, wherein each of the pixels encompasses (a) a semiconductor photoelectric conversion element encompassing a charge generation region of a first conductivity type, and a part of a surface buried region of a second conductivity type of an opposite conductivity type to the first conductivity type on the charge generation region, configured to receive an optical pulse, which is reflected by a target sample, and to convert the optical signal into signal charges in the charge generation region; (b) first and second transfer gate electrodes configured to electrostatically control potentials of first and second transfer channels implemented by another part of the surface buried region adjacent to a part of the surface buried region directly over the charge generation region, through insulating films formed on the first and second transfer channels, respectively, and configured to alternately transfer the signal charges through the first and second transfer channels; and (c) first and second floating drain regions configured to accumulate the signal charges transferred by the first and second transfer gate electrodes, sequentially and respectively, having the second conductivity type and a higher impurity concentration than the surface buried region. In accordance with the solid-state imaging device pertaining to the third aspect, pulse signals are sequentially applied to the first and second transfer gate electrodes in all of the pixels, in synchronization with the optical pulse, and in each of the pixels, a range to the target sample is measured in accordance with a distribution ratio between the charges accumulated in the first and second floating drain regions, and all of the pixels are two-dimensionally accessed, and a two-dimensional picture corresponding to the measured ranges is obtained.

BRIEF DESCRIPTION OF THE DRAWINGS

FIG. 9 is a process-flow cross-sectional view (No. 3) describing the manufacturing method of the semiconductor range-finding element and solid-state imaging device, according to the first embodiment of the present invention;

DETAILED DESCRIPTION OF THE INVENTION

Figure 14:
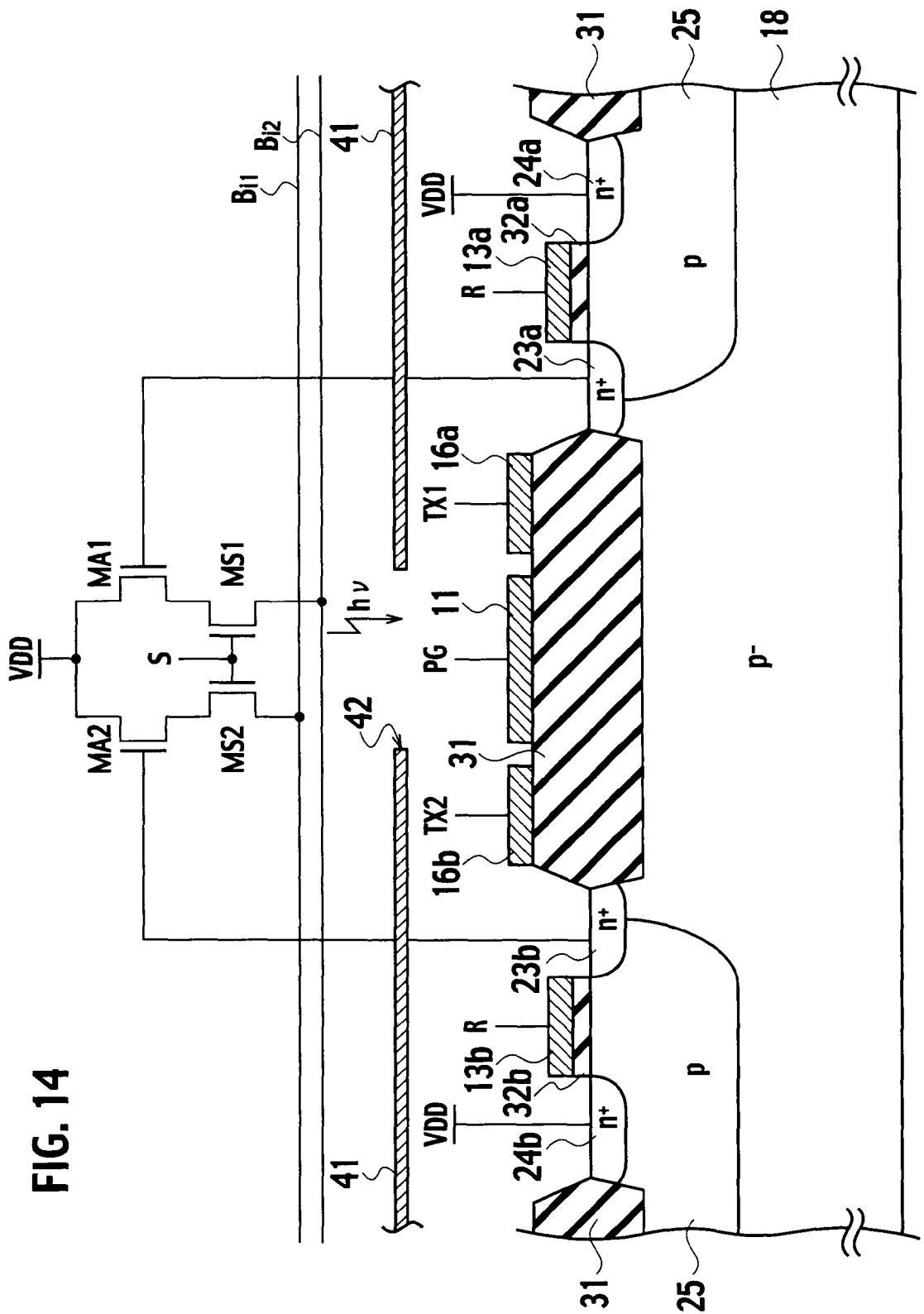
FIG. 14 is a diagrammatic cross-sectional view describing a schematic configuration of the TOF range-finding sensor proposed in Japanese Laid Open Patent Application (JP 2005-235893A), the entire contents of which are incorporated by reference in this specification.

Already, one of the inventors proposed a TOF range-finding sensor, which uses the region of a p-type semiconductor substrate 18 under a field oxide film 31 as shown in FIG. 14, as an active layer, in Japanese Laid Open Patent Application (JP 2005-235893A), the entire contents of which are incorporated by reference in this specification. The structure shown in FIG. 14 is the TOF range-finding sensor that can be manufactured by manufacturing step of a standard CMOS image sensor, and gate electrodes 11, 16a and 16b made of, for example, poly-silicon transparent to light are formed on the field oxide film 31. The structure shown in FIG. 14 is intended to establish a sufficient fringing electric field by designing the MOS structure, in which in order to transfer the charges from the region directly under a central gate electrode 11 to which the light is irradiated, to a first floating drain region 23a and a second floating drain region 23b on the right and left sides at a high speed, the p-type semiconductor substrate 18 having a low impurity concentration is used as the active layer, and the thick field oxide film 31 is further provided as an insulating film for the MOS structure.

However, the subsequent discussion revealed that the structure shown in FIG. 14 had two problems to be solved for providing the TOF range-finding sensor having a high performance. One problem lies in the fact that, when near-infrared light is used as the light source used in the TOF range-finding sensor, the electrons generated in the very deep portion in the p-type semiconductor substrate 18 are diffused and slowly transported to the surface, and the response of the charge detection to the optical pulse is delayed. The other problem lies in the fact that, since the surface channel is used, the electrons captured on the interface between the p-type semiconductor substrate 18 and the field oxide film 31 are discharged after the elapse of a certain time, and the delay is consequently generated in the response. So, in the solid-state imaging device (two-dimensional image sensor) according to the first and second embodiments of the present invention, the pixel structure is provided in which the behavior of the TOF range-finding sensor proposed in JP 2005-235893A is further improved, thereby facilitating a higher speed operation.

In the illustrations of the drawings according to the first and second embodiments, the same or similar reference numerals are applied to the same or similar parts and elements. However, the first and second embodiments only exemplify the apparatus and method that embody the technical idea of the present invention. As for the technical idea of the present invention, the configurations and arrangements of the circuit elements and circuit blocks, or the layouts on semiconductor chips, and the like are not limited to the following descriptions. Various changes can be added to the technical idea of the present invention, within the technical range described in claims.

By the way, in the following descriptions of the first and second embodiments, a first conductivity type is explained as the p-type, and a second conductivity type is explained as the n-type. However, the fact would be easily understood in which, even when the first conductivity type is defined as the n-type and the second conductivity type is defined as the p-type, if the electric polarities are made opposite, the similar effectiveness can be obtained.

First Embodiment

Figure 1:
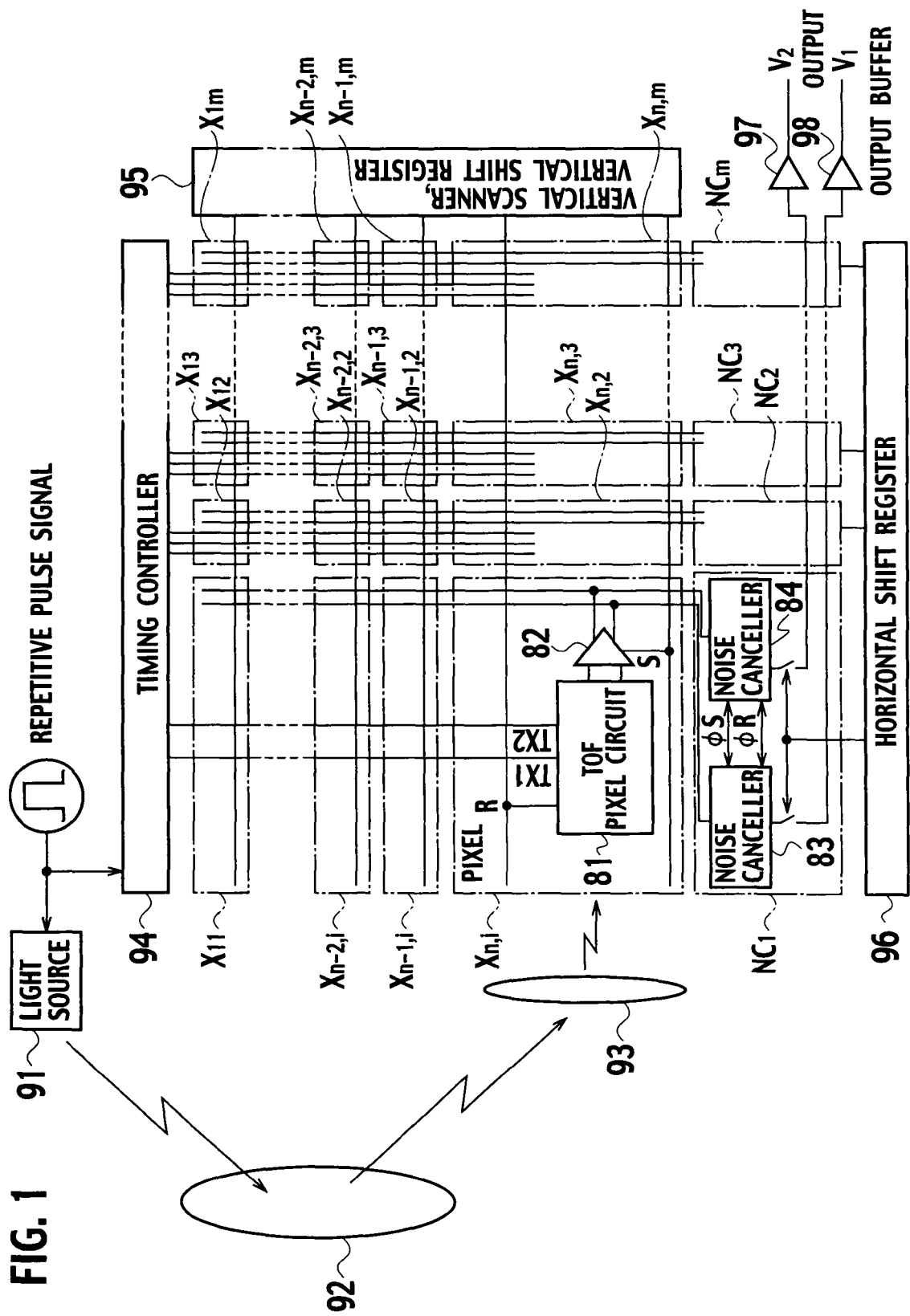
FIG. 1 is a diagrammatic plan view describing a layout on a semiconductor chip of a solid-state imaging device (two-dimensional image sensor) according to a first embodiment of the present invention.

In a solid-state imaging device (two-dimensional image sensor) according to the first embodiment of the present invention, as shown in FIG. 1, pixel arrays ($X_{11}$ to $X_{1m}$, $X_{21}$ to $X_{2m}$, . . . $X_{n1}$ to $X_{nm}$) and peripheral circuits (94, 95, 96, and $NC_1$ to $NC_m$) are integrated on a same semiconductor chip. A large number of pixels $X_{ij}$ (i=1 to m, j=1 to n, and the m, n are integers, respectively) are two-dimensionally arrayed in the pixel arrays, and a rectangular imaging region is implemented. Then, the timing controller 94 is installed on the upper side of this pixel array, and the horizontal shift register 96 is installed on the lower side, respectively along pixel rows $X_{11}$ to $X_{1m}$, $X_{21}$ to $X_{2m}$, . . . , $X_{n1}$ to $X_{nm}$ directions. On the right side of the pixel array, a vertical shift register and a vertical scanner 95 are installed along pixel columns $X_{11}$ to $X_{n1}$, $X_{12}$ to $X_{n2}$, . . . , $X_{1j}$ to $X_{nj}$, . . . $X_{1m}$ to $X_{nm}$ directions. As illustrated an inner structure in the pixel $X_{nj}$, each pixel $X_{ij}$ embraces a TOF pixel circuit 81 having a semiconductor photoelectric converting element and a charge transferring segment and a voltage-read-out buffer amplifier 82.

The pixels $X_{ij}$ arrayed in the inside of the pixel array are sequentially scanned by the timing controller 94, the horizontal shift register 96 and the vertical shift register and vertical scanner 95. Then, the reading out of pixel signals and an electronic-shuttering operation are executed. That is, the solid-state imaging device according to the first embodiment of the present invention is designed such that, while the pixel array is vertically scanned at the respective pixel rows $X_{11}$ to $X_{1m}$, $X_{21}$ to $X_{2m}$, . . . , $X_{n1}$ to $X_{nm}$, the pixel signals on each of the pixel rows $X_{11}$ to $X_{1m}$, $X_{21}$ to $X_{2m}$, . . . , $X_{n1}$ to $X_{nm}$ are read out through the vertical signal lines connected to each of the pixel columns $X_{11}$ to $X_{n1}$, $X_{12}$ to $X_{n2}$, . . . , $X_{1j}$ to $X_{nj}$, . . . , $X_{1m}$ to $X_{nm}$.

The signal read-out operation from the respective pixel $X_{11}$ to $X_{1m}$, $X_{21}$ to $X_{2m}$, . . . , $X_{n1}$ to $X_{nm}$ are roughly similar to the earlier CMOS image sensor. However, control signals TX1 ($\phi$1), TX2($\phi$2) for the charge transfers from the respective photodiodes in the respective pixels $X_{11}$ to $X_{1m}$, $X_{21}$ to $X_{2m}$, . . . , $X_{n1}$ to $X_{nm}$ are applied to all of the pixels $X_{11}$ to $X_{1m}$, $X_{21}$ to $X_{2m}$, . . . , $X_{n1}$ to $X_{nm}$ by the timing controller 94 at the same time, and because of the signals of high frequencies, switching noises are generated in the periods. Thus, the signal read-out operation from the pixels are executed by providing a signal read-out period after the completion of the processes executed by the noise processing circuits $NC_1$ to $NC_m$.

Figure 2:
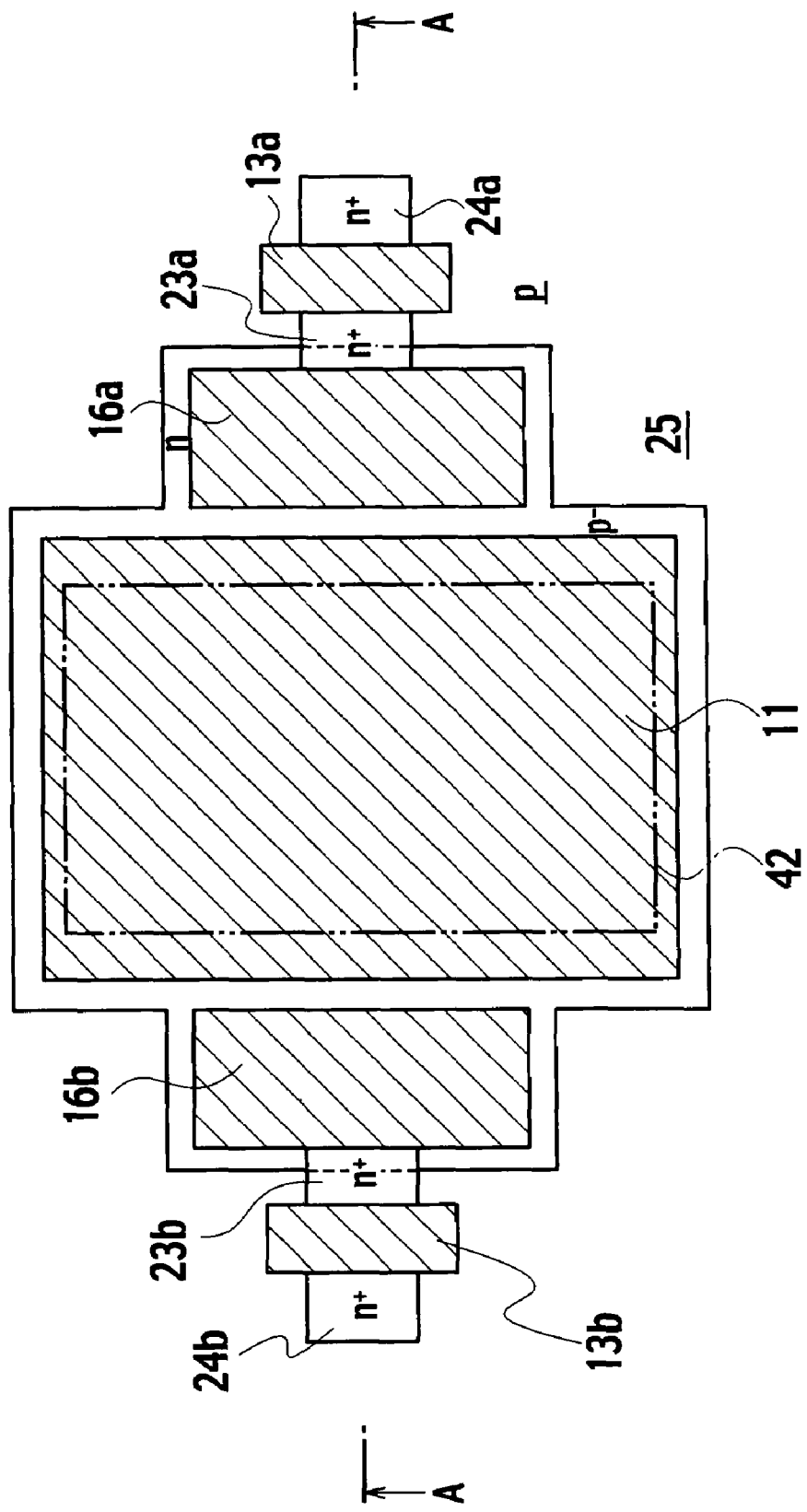
FIG. 2 is a schematic plan view describing a configuration of a semiconductor range-finding element serving as a part of pixels in the solid-state imaging device according to the first embodiment of the present invention.
Figure 3:
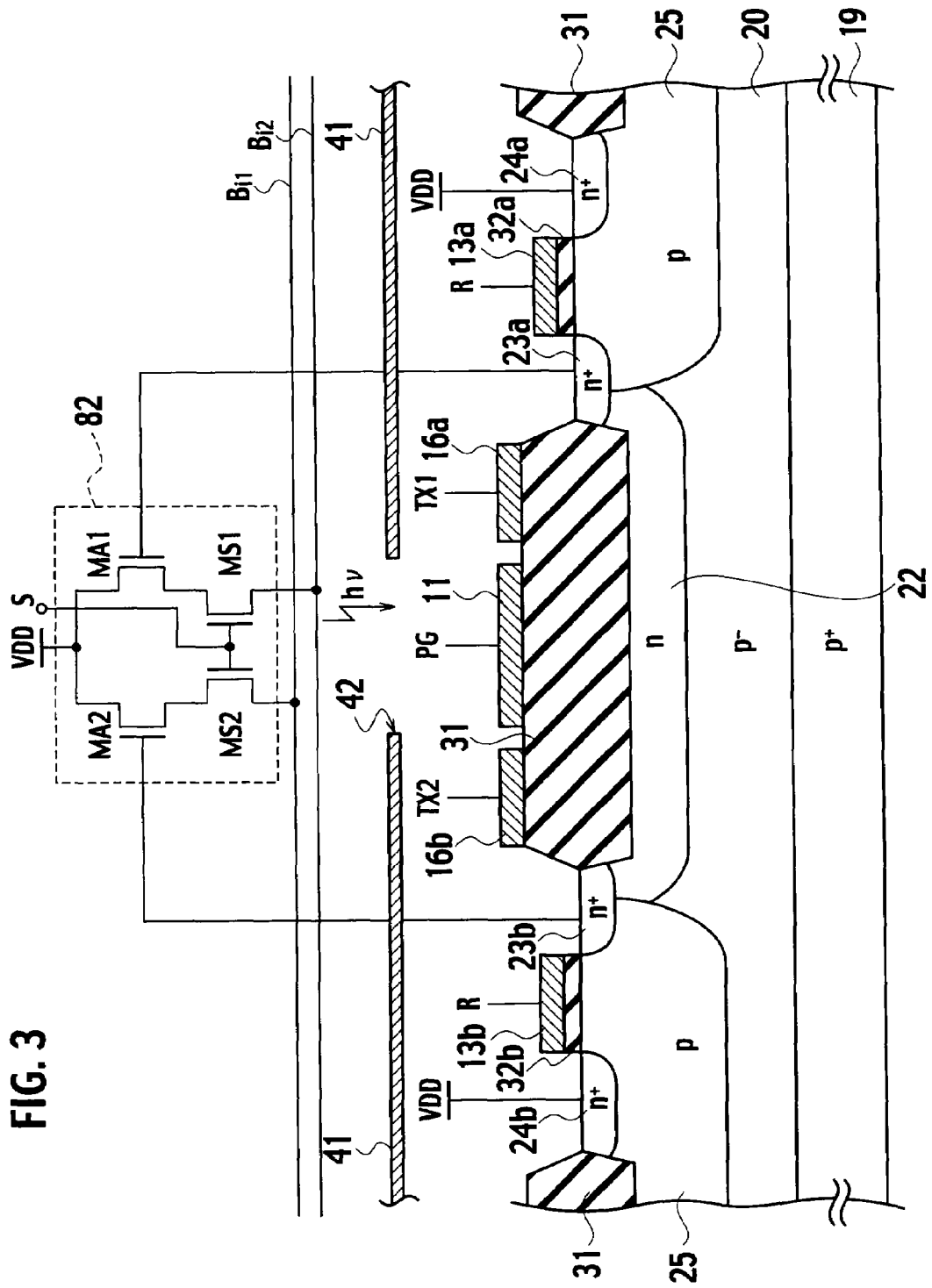
FIG. 3 is a diagrammatic cross-sectional view that is viewed from an A-A direction in FIG. 2.

FIG. 2 shows, as one example, a plan view of the semiconductor range-finding element serving as the TOF pixel circuit 81 assigned in each of the pixels $X_{11}$ to $X_{1m}$, $X_{21}$ to $X_{2m}$, ..., $X_{n1}$ to $X_{nm}$ in the solid-state imaging device according to the first embodiment. A semiconductor photoelectric conversion element is formed directly under a light-receiving gate electrode 11 shown on the center of FIG. 2, and a first transfer gate electrode 16a and a second transfer gate electrode 16b, which transfer the signal charges generated by the semiconductor photoelectric conversion element alternately in right and left directions, are arranged on both sides of the light-receiving gate electrode 11. The light emitted as a repetitive pulse signal by a light source 91 in FIG. 1 is reflected by a target sample 92 and irradiate on the semiconductor photoelectric conversion element through an opening 42 of a light shielding film (a light shielding film 41 is shown in FIG. 3) indicated by a dot-dashed line going around the periphery of the light-receiving gate electrode 11 in FIG. 2. That is, the semiconductor photoelectric conversion element receives the optical pulse, which is irradiated through the opening 42 of the light shielding film 41, as an optical signal and converts this optical signal into the signal charges.

Moreover, as shown in FIG. 2, the first floating drain region 23a for accumulating the signal charges transferred by the first transfer gate electrode 16a is arranged on the right side, and the second floating drain region 23b for accumulating the signal charges transferred by the second transfer gate electrode 16b is arranged on the left side. A first reset gate electrode 13a adjacent to the first floating drain region 23a and a first reset source region 24a, which is opposite to the first floating drain region 23a with respect to the first reset gate electrode 13a, are further arranged on the right side of FIG. 2. On the other hand, a second reset gate electrode 13b adjacent to the second floating drain region 23b and a second reset source region 24b, which is opposite to the second floating drain region 23b with respect to the second reset gate electrode 13b are further arranged on the left side of FIG. 2. A MOS transistor serving as a first reset transistor is established by the first floating drain region 23a, the first reset gate electrode 13a and the first reset source region 24a, and a MOS transistor serving as a second reset transistor is established by the second floating drain region 23b, the second reset gate electrode 13b and the second reset source region 24b. For the respective first reset gate electrode 13a and second reset gate electrode 13b, control signals R are all set at a high (H) level, and the charges accumulated in the first floating drain region 23a and the second floating drain region 23b are discharged to the first reset source region 24a and the second reset source region 24b, respectively, and the first floating drain region 23a and the second floating drain region 23b are reset.

As shown in FIG. 2, in the semiconductor range-finding element according to the first embodiment, in such a way that the signal charges generated by the semiconductor photoelectric conversion element are transferred in the directions opposite to each other (the right and left directions), on a planar pattern, the respective central lines (not shown) of the first transfer gate electrode and the second transfer gate electrode are aligned on the same straight line. Then, the respective widths of the first transfer gate electrode 16a and the second transfer gate electrode 16b, which are measured in the direction orthogonal to the transfer direction of the signal charges (the upper and lower direction in FIG. 2) are made narrower than the width of the light-receiving gate electrode 11 that is measured in the orthogonal direction. Thus, even if the area of the light-receiving region directly under the light-receiving gate electrode 11 is made large, the perfect transfers of the signal charges that are carried out by the first transfer gate electrode 16a and the second transfer gate electrode 16b can be executed.

FIG. 3 is the cross-sectional structure of the semiconductor range-finding element and shows a semiconductor substrate 19 of the first conductivity type (p-type), a semiconductor layer (epitaxial growth layer) 20 of the first conductivity type (p-type) arranged on the semiconductor substrate 19, and a surface buried region 22 of the second conductivity type (n-type) arranged on the semiconductor layer (epitaxial growth layer) 20. The semiconductor photoelectric conversion element is implemented by an insulating film 31 directly under the light-receiving gate electrode 11 in the central portion, the surface buried region 22, the semiconductor layer (epitaxial growth layer) 20 and the semiconductor substrate 19. A part of the semiconductor layer (epitaxial growth layer) 20 of the first conductivity type (p-type) located directly under the light-receiving gate electrode 11 serves as the charge generation region of the semiconductor photoelectric conversion element. The carriers (electrons) generated in the charge generation region are injected into a sub-area of the surface buried region 22 directly over the charge generation region.

The insulating film 31 extends from directly under the light-receiving gate electrode 11 to under the first transfer gate electrode 16a and the second transfer gate electrode 16b in the right and left portion. Below the insulating film 31, the surface buried region 22 is buried to extend from directly under the light-receiving gate electrode 11 to under the first transfer gate electrode 16a and the second transfer gate electrode 16b in the right and left directions. That is, in the surface buried region (another sub-area of the surface buried region 22) 22 adjacent to the right side of the surface buried region 22 directly under the light-receiving gate electrode 11 (directly over the charge generation region), the site located directly under the first transfer gate electrode 16a serves as a first transfer channel. On the other hand, in the surface buried region (a still another sub-area of the surface buried region 22) 22 adjacent to the left side of the surface buried region 22 directly under the light-receiving gate electrode 11 (directly over the charge generation region), the site located directly under the second transfer gate electrode 16b serves as a second transfer channel. Then, the first transfer gate electrode 16a and the second transfer gate electrode 16b electrostatically control the potentials of the first and second transfer channels through the insulating films 31 formed on those first and second transfer channels, respectively, and transfer the signal charges alternately through the first and second transfer channels to the first floating drain region 23a and the second floating drain region 23b of the second conductivity type (n-type), respectively. Each of the first floating drain region 23a and the second floating drain region 23b is the semiconductor region having a higher impurity concentration than the surface buried region 22. As evident from FIG. 3, the surface buried region 22 is formed to contact with the first floating drain region 23a and the second floating drain region 23b in the right and left portions.

As shown in FIG. 3, a gate electrode of a signal-read-out transistor (amplification transistor) MA1 implementing the voltage-read-out buffer amplifier 82 is connected to the first floating drain region 23a, and a gate electrode of a signal-read-out transistor (amplification transistor) MA2 of the voltage-read-out buffer amplifier 82 is connected to the second floating drain region 23b. A source electrode of the signal-read-out transistor (amplification transistor) MA1 is connected to a power supply VDD, and a drain electrode is connected to a source electrode of a switching transistor MS1, which is adapted for selecting pixel. A drain electrode of the switching transistor MS1 adapted for selecting pixel is connected to a vertical signal line $B_{i2}$, and a control signal S for selecting a horizontal line is applied to the gate electrodes by the vertical shift register and vertical scanner 95. A source electrode of the signal-read-out transistor (amplification transistor) MA2 is connected to the power supply VDD, and a drain electrode is connected to a source electrode of a switching transistor MS2 adapted for selecting pixel. A drain electrode of the switching transistor MS2 adapted for selecting pixel is connected to a vertical signal line $B_{i1}$, and the control signal S for selecting the horizontal line is applied to the gate electrodes by the vertical shift register and vertical scanner 95. Since the selecting control signal S is set at high (H) level, the switching transistors MS1, MS2 are turned on, and the currents which are amplified by the signal-read-out transistors (amplification transistors) MA1, MA2 and correspond to the potentials of the first floating drain region 23a and the second floating drain region 23b flow through the vertical signal lines $B_{i2}$, $B_{i1}$.

The impurity concentration of the semiconductor layer 20 serving as the charge generation region is lower than the impurity concentration of the semiconductor substrate 19. That is, the semiconductor substrate 19 is preferred to have the impurity concentration of about $4 \times 10^{17}$ cm$^{-3}$ or more and about $1 \times 10^{21}$ cm$^{-3}$ or less, and the semiconductor layer (epitaxial growth layer) 20 serving as the charge generation region is preferred to have the impurity concentration of about $6 \times 10^{11}$ cm$^{-3}$ or more and about $2 \times 10^{15}$ cm$^{-3}$ or less.

In particular, when the semiconductor substrate 19 is a silicon substrate having the impurity concentration of about $4 \times 10^{17}$ cm$^{-3}$ or more and about $1 \times 10^{21}$ cm$^{-3}$ or less, and the semiconductor layer (epitaxial growth layer) 20 is elected to be a silicon epitaxial growth layer 20 having the impurity concentration of about $6 \times 10^{11}$ cm$^{-3}$ or more and about $2 \times 10^{15}$ cm$^{-3}$ or less, conventional CMOS process can be employed. As the insulating film 31, it is possible to use the field oxide film made by a selective oxidization method, which is called "a LOCOS (Local oxidation of silicon) method", used for the element isolation architecture. From the viewpoint of industrial meaning, in the case of the semiconductor substrate 19 having the impurity concentration of about $8 \times 10^{17}$ cm$^{-3}$ or more and about $1 \times 10^{20}$ cm$^{-3}$ or less and the silicon epitaxial semiconductor layer 20 having the impurity concentration of about $6 \times 10^{13}$ cm$^{-3}$ or more and about $1.5 \times 10^{15}$ cm$^{-3}$ or less, the availability on the market is easy, and these device parameters are preferable. The thickness of the silicon epitaxial semiconductor layer 20 may be between about 4 and 20 µm and preferably between about 6 and 10 µm. The semiconductor layers (epitaxial growth layers) 20 located directly under the light-receiving gate electrode 11 and directly under the first transfer gate electrode 16a and the second transfer gate electrode 16b in the right and left portions are the regions in which the p-wells and n-wells, being essential in conventional CMOS process, are not provided.

On the other hand, the surface buried region 22 can employ the value of the impurity concentration of about $5 \times 10^{14}$ cm$^{-3}$ or more and about $5 \times 10^{16}$ cm$^{-3}$ or less, typically, for example, the impurity concentration of about $1 \times 10^{15}$ cm$^{-3}$, and its thickness can be between about 0.1 and 3 µm, preferably between about 0.5 and 1.5 µm.

When the insulating film 31 is made of thermally oxidized film, the thickness of the thermally oxidized film may be elected to be about 150 nm or more and about 1000 nm or less, and preferred to be about 200 nm or more and about 400 nm or less. When the insulating film 31 is made of dielectric film other than the thermally oxidized film, its thickness may be "the equivalent thickness" in terms of the dielectric constant $\in_r$ (at 1 MHz, $\in_r=3.8$) of the thermally oxidized film. For example, when the CVD oxide film having a dielectric constant $\in_r=4.4$ is used, the equivalent thickness may be employed that is 1.16 times (4.4/3.8) of the thickness of the thermally oxidized film, and when the silicon nitride ($Si_3N_4$) film having a dielectric constant $\in_r=7$ is used, the equivalent thickness may be employed that is 1.84 times (7/3.8) of the thickness of the thermally oxidized film. However, the oxide film ($SiO_2$ film) formed by the standard CMOS technique is preferred to be used, and the use of the field oxide film in the CMOS technique is suitable for the simplification of the manufacturing step.

Figure 4:
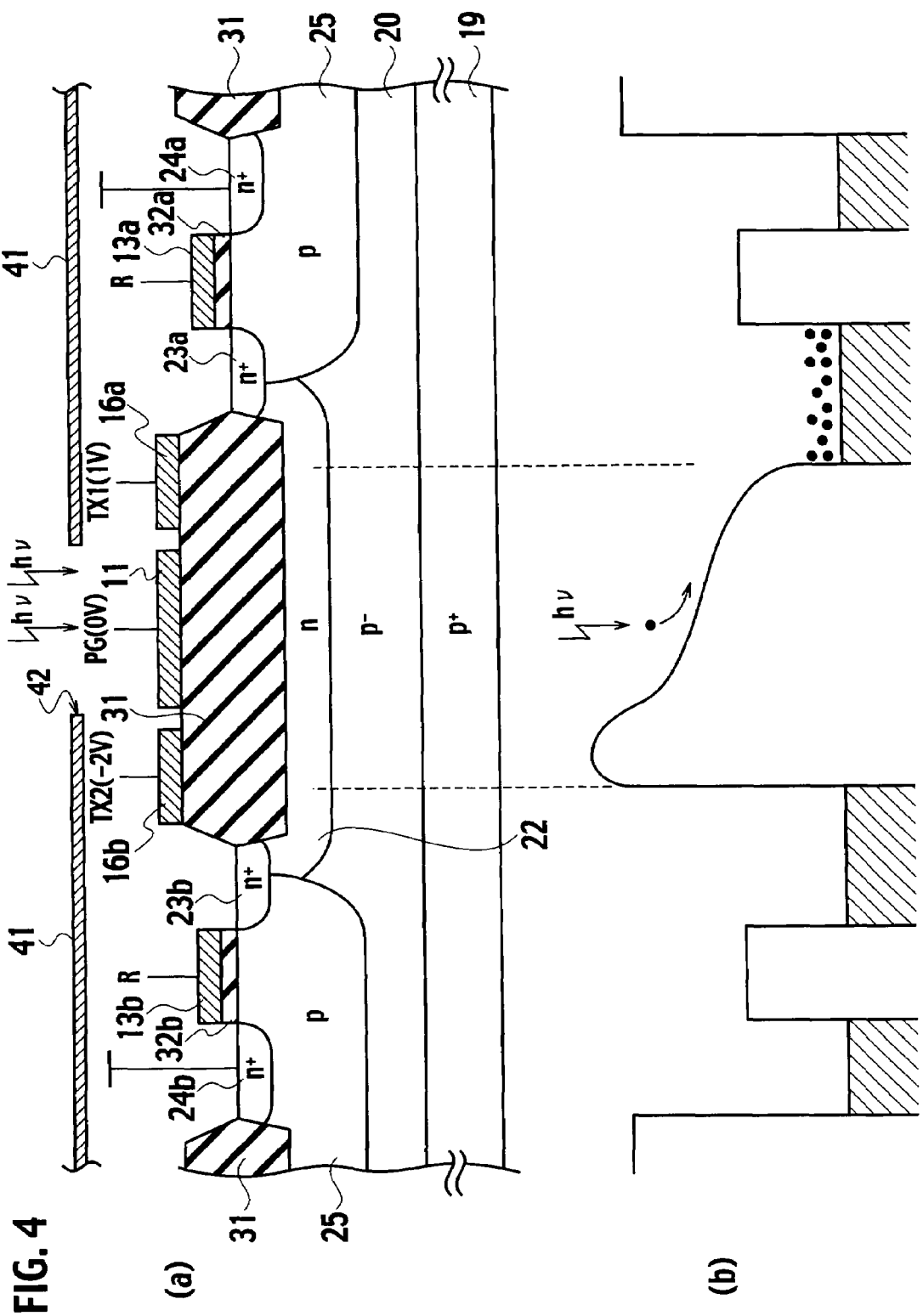
FIG. 4 is a diagrammatic view explaining: a potential distribution in a surface buried region when a pulse signal TX1=1V is applied to a first transfer gate electrode and when a pulse signal TX2=−2V is applied to a second transfer gate electrode; and a manner of a transfer of signal charges to a first floating drain region.
Figure 5:
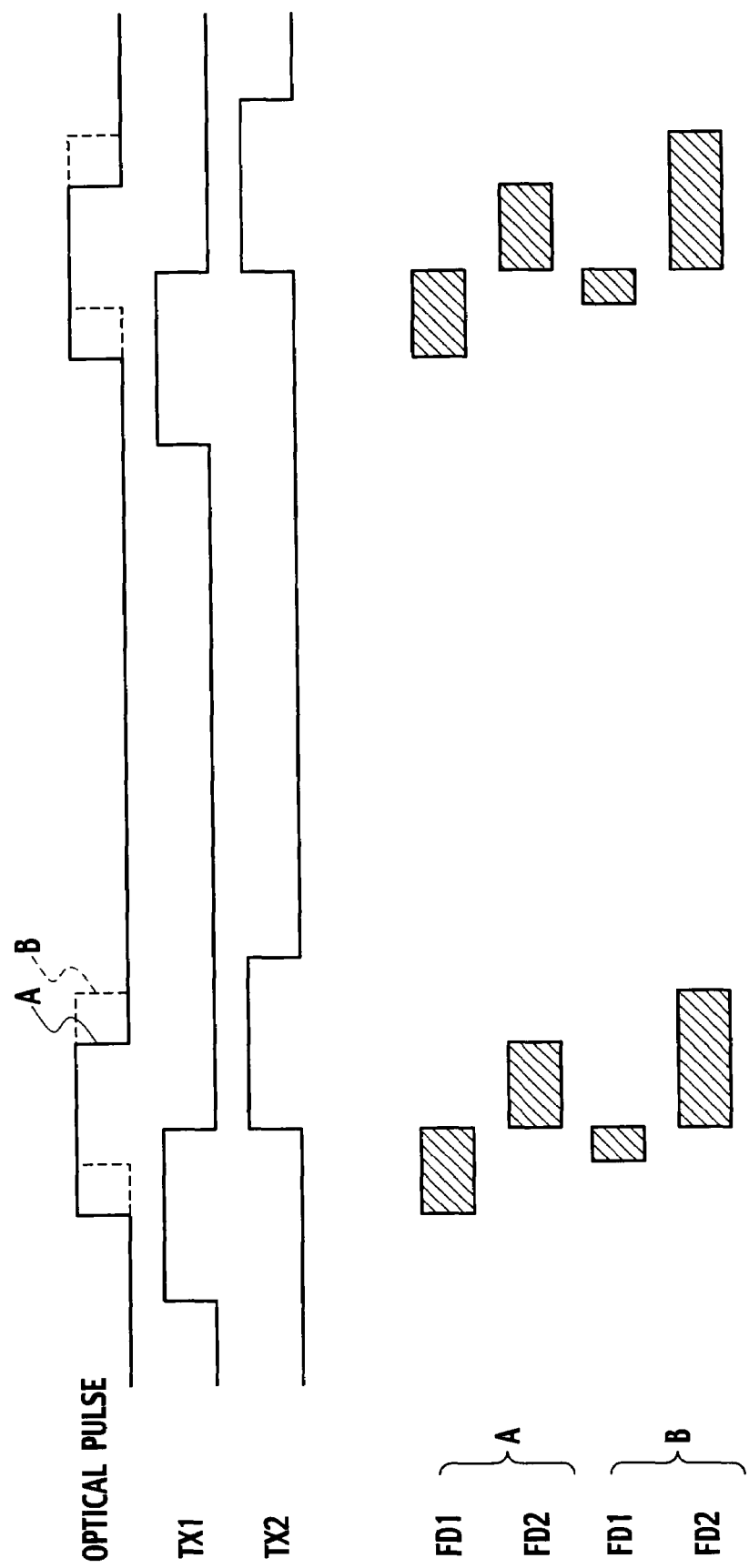
FIG. 5 is a timing chart describing a relation of an operational timing between optical pulses entered to a light-receiving gate electrode in the semiconductor range-finding element according to the first embodiment and the pulse signals applied to the first transfer gate electrode and the second transfer gate electrode.

The pulse signal TX1 as shown in FIG. 5 is applied to the first transfer gate electrode 16a formed on the insulating film (field oxide film) 31, and the pulse signal TX2 in FIG. 5 is applied to the second transfer gate electrode 16b. A constant voltage PG, for example, 0 V is applied to the central light-receiving gate electrode 11. For example, when the pulse signal TX1=1V is applied to the first transfer gate electrode 16a and the pulse signal TX2=−2V is applied to the second transfer gate electrode 16b, the potential distribution in the surface buried region 22 is as shown in FIG. 4(b). Then, the electrons generated by the optical signal are transferred to the floating drain region 23a on the right side. Reversely, when the pulse signal TX1=−2V is applied to the first transfer gate electrode 16a and the pulse signal TX2=1V is applied to the second transfer gate electrode 16b, the electrons generated by the optical signal are transferred to the floating drain region 23b on the left side. The charge transfers, which are carried out by the first transfer gate electrode 16a and the second transfer gate electrode 16b, are carried out at the high speed, because the surface buried region 22 is used and the carriers (electrons) run through the bulk portion deeper than the interface with the insulating film (field oxide film) 31 so that the influence of the interface levels and surface scatterings on the interface between the insulating film (field oxide film) 31 does not affect the carrier transport. That is, the n-type surface buried region 22 is formed on the p-type silicon epitaxial growth layer 20. Thus, the potential in the deep direction, which enables the carriers (electrons) to run through the deep region near the interface between the n-type surface buried region 22 and the p-type silicon epitaxial growth layer 20, is formed, which disables the capture of the carriers (electrons) that are generated by the light in the level of the interface between the semiconductor region and the field oxide film 31.

Moreover, when there is no surface buried region 22, it takes a long time until the electrons generated in the neutral region in the deep poison of the p-type silicon epitaxial growth layer 20 are diffused and transported to the vicinity of the semiconductor surface near the insulating film (field oxide film) 31. This phenomenon causes a timing lag between the irradiation of optical pulse and the detection of generated electrons. However, since the surface buried region 22 is installed, the electrons generated in the neutral region in the deep portion of the p-type silicon epitaxial growth layer 20 serving as the charge generation region are injected into the surface buried region 22 at a short time. Consequently, the influence caused by the timing lag between the optical pulse and the detection of the generated electron is reduced.

In the semiconductor range-finding element according to the first embodiment, for example, when the optical pulse as shown in FIG. 5 is emitted, the signal charges caused by the optical pulse irradiated in the period when the pulse signal TX1=1V are transferred to the floating drain region 23a on the right side, and the signal charges caused by the optical pulse irradiated in the period when the pulse signal TX2=1V are transferred to the floating drain region 23b on the left side. At this time, if the optical pulse has the waveform of A shown in FIG. 5, the quantities of the electrons (signal charges) respectively transferred to the first floating drain region 23a and the second floating drain region 23b are equal. On the other hand, if a delayed optical pulse such as the waveform of B indicated by the dashed line in FIG. 5 is irradiated, the signal charge quantity transferred to the floating drain region 23b on the left side is increased. Thus, when the difference between the quantities of the electrons (signal charges) accumulated in the first floating drain region 23a on the right side and the second floating drain region 23b on the left side is determined, the time lag of the optical pulse can be estimated.

In short, an estimated range L determined by the semiconductor range-finding element according to the first embodiment is given by the distribution ratio between signal charges $Q_1$ that are transferred to and accumulated in the left floating drain region 23b and signal charges $Q_2$ that are transferred to and accumulated in the right floating drain region 23a, as indicated by Eq. (1).

$$L=(cT_0/2)(Q_2/(Q_1+Q_2)) \quad (1)$$

Here, c is the light speed, and $T_0$ is the pulse width of the optical pulse.

In order to satisfy Eq. (1), it is necessary to create the structure in which the signal charges generated by the optical signal in the semiconductor layer 20 serving as the charge generation region of the semiconductor range-finding element are delivered into the first floating drain region 23a and the second floating drain region 23b in a very short time, as compared with the pulse width $T_0$ of the optical pulse. Therefore, the semiconductor range-finding element according to the first embodiment is designed to have the structure that can establish a sufficiently large lateral fringing electric field in the surface buried regions 22 directly under the first transfer gate electrode 16a and the second transfer gate electrode 16b. That is, a parallel plate capacitor is built in the structure in which the insulating film (field oxide film) 31 made of a thick oxide film is formed on the p-type silicon epitaxial growth layer 20 having a low impurity concentration, and the light-receiving gate electrode 11, the first transfer gate electrode 16a and the second transfer gate electrode 16b are provided thereon. As evident from the Gauss's law, in the parallel plate capacitor, the electric field distribution is deviated from the fields of the parallel plate approximation, at fringing portions directly under the insulating film (field oxide film) 31, each of the position of the fringing portions corresponds to the respective end of the first transfer gate electrode 16a and the second transfer gate electrode 16b. Thus, because the vertical electric fields induced by the potentials between the first transfer gate electrode 16a and the second transfer gate electrode 16b are relatively small at fringing portions, the fringing electric fields implemented by the electric fields having directions other than the vertical direction are established. The component of the fringing electric field increases with the thickness of the insulating film (field oxide film) 31. In particular, when the thickness is elected to be about 150 nm or more and about 1000 nm or less in terms of the dielectric constant of the thermally oxidized film, sufficient fringing electric fields (lateral electric fields) for accelerating carriers (electrons) running parallel to the surface of the substrate are established. As the thickness of the insulating film (field oxide film) 31 becomes thick, the fringing electric fields (in short, the lateral electric fields at the electrode end) are easily induced. However, when the thickness of the insulating film (field oxide film) 31 is made excessively thicker, the electric field strength by itself becomes weaker, and the lateral electric fields at the electrode ends become smaller as well. Thus, the thickness of about 1000 nm or more in terms of the dielectric constant of the thermally oxidized film is not preferable. Hence, the thickness of about 200 nm or more and about 400 nm or less in terms of the dielectric constant of the thermally oxidized film is preferable because the fringing electric fields are sufficiently large.

As shown in FIG. 2 and FIG. 3, a gap between the light-receiving gate electrode 11 and the first transfer gate electrode 16a and a gap between the light-receiving gate electrode 11 and the second transfer gate electrode 16b are preferred to be 1 μm or less. With regard to CCD and the like, a technique of double-layer poly-silicon is known, facilitating a miniaturization of the gaps between the transfer gate electrodes adjacent to each other so as to suppress the formation of the potential barriers in the gaps. However, also in the semiconductor range-finding element according to the first embodiment, the gap between the light-receiving gate electrode 11 and the first transfer gate electrode 16a and the gap between the light-receiving gate electrode 11 and the second transfer gate electrode 16b are desired to be narrowed to the minimal gap dimension that is allowed by the state-of-the-art micro-fabrication technique. By using a double exposure technique or an opening contraction technique that uses a TEOS (tetra ethyl ortho-silicate) film deposited by CVD or the like, it is possible to achieve the gap of 60 nm or less or 50 nm or less, even in optical exposure. In the semiconductor range-finding element according to the first embodiment, if the thickness of the insulating film (field oxide film) 31 is elected to be about 150 nm or more and about 1000 nm or less in terms of the dielectric constant of the thermally oxidized film, the gap between the light-receiving gate electrode 11 and the first transfer gate electrode 16a and the gap between the light-receiving gate electrode 11 and the second transfer gate electrode 16b can be made finer and finer by using the advanced micro-fabrication technique so that potential fluctuation is generated in the surface buried regions 22 directly under the gap between the light-receiving gate electrode 11 and the first transfer gate electrode 16a and directly under the gap between the light-receiving gate electrode 11 and the second transfer gate electrode 16b, therefore, even the single-layer electrode structure (for example, the single-layer poly-silicon electrode structure) is used as shown in FIG. 3, it is possible to suppress the formation of the potential barriers.

<Operation of Solid-State Imaging Device>

Figure 6:
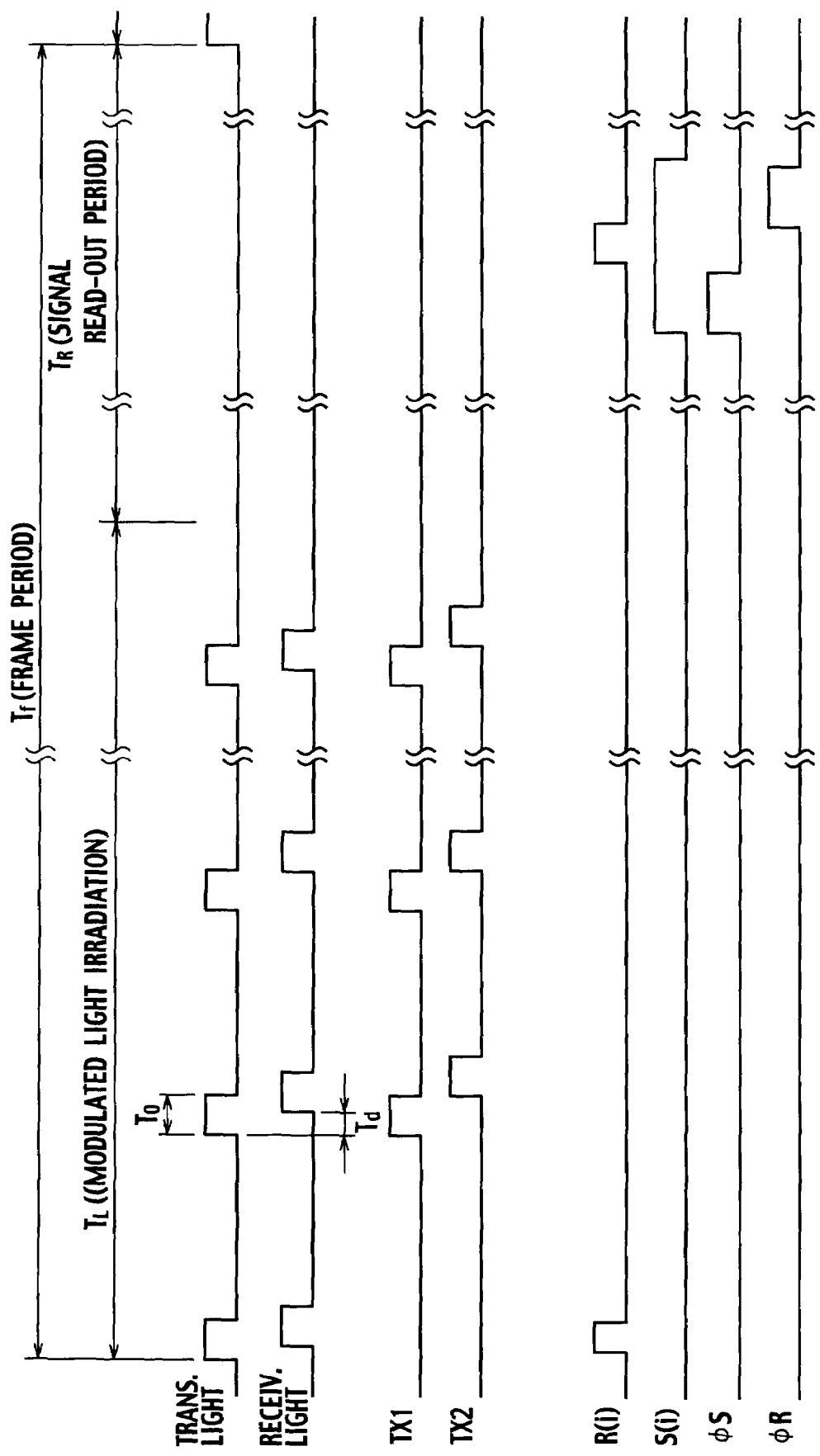
FIG. 6 is a timing chart describing the operations of the solid-state imaging device according to the first embodiment shown in FIG. 1.

The operations of the solid-state imaging device (two-dimensional image sensor) according to the first embodiment of the present invention whose schematic organization is shown in FIG. 1 will be described below by using FIG. 6.

(a) For the first reset gate electrode 13a and the second reset gate electrode 13b in each of all the pixels $X_{11}$ to $X_{1m}$, $X_{21}$ to $X_{2m}$, ..., $X_{n1}$ to $X_{nm}$ shown in FIG. 1, the control signals R are all set at high (H) level, and the charges accumulated in the first floating drain region 23a and the second floating drain region 23b are discharged to the first reset source region 24a and the second reset source region 24b, respectively, and the first floating drain region 23a and the second floating drain region 23b are reset.

(b) After that, the optical pulse is emitted from the light source 91, and the optical pulse reflected by the target sample 92 enters through the opening 42 of the light shielding film 41 in each of the pixels $X_{11}$ to $X_{1m}$, $X_{21}$ to $X_{2m}$, ..., $X_{n1}$ to $X_{nm}$ to each of the semiconductor photoelectric conversion elements. In synchronization with the optical pulse, the repetitive pulses TX1, TX2 are applied to the first transfer gate electrode 16a and the second transfer gate electrode 16b in each of all the pixels $X_{11}$ to $X_{1m}$, $X_{21}$ to $X_{2m}$, ..., $X_{n1}$ to $X_{nm}$ at the timing as shown in FIG. 6, all at once, and the first transfer gate electrode 16a and the second transfer gate electrode 16b are driven for a predetermined constant period.

(c) After that, the emission of the optical pulse from the light source 91 is stopped, and the voltages of the first floating drain region 23a and the second floating drain region 23b are read out to the outside by using the voltage-read-out buffer amplifier 82. In this read-out period, so that the charges generated by the background light signal do not flow in the first floating drain region 23a and the second floating drain region 23b, negative voltages are applied to the first transfer gate electrode 16a and the second transfer gate electrode 16b. (d) As for the reading out, the voltages of the first floating drain region 23a and the second floating drain region 23b are read out to the noise processing circuits $NC_1$ to $NC_m$ of the corresponding column, and in each of the noise processing circuits $NC_1$ to $NC_m$, noise canceling are carried out by a noise canceller 83 and a noise canceller 84, and a horizontal scanning is then executed. The selection of one horizontal line is carried out by applying the control signal S to the switching transistors MS1, MS2 adapted for selecting pixel in the voltage-read-out buffer amplifiers 82 inside the pixels $X_{11}$ to $X_{1m}$, $X_{21}$ to $X_{2m}$, ..., $X_{n1}$ to $X_{nm}$. Then, the signal of the horizontal line corresponding to a vertical signal appears. In order to decrease the fixed pattern noise and 1/f noise which are generated by the voltage-read-out buffer amplifier 82 in each of the pixels $X_{11}$ to $X_{1m}$, $X_{21}$ to $X_{2m}$, ..., $X_{n1}$ to $X_{nm}$, the noise canceller 83 and the noise canceller 84 determine the difference between the signal level and the level when the first floating drain region 23a and the second floating drain region 23b are reset. The noise canceller 83 and the noise canceller 84 are the circuits for sampling the signal level and the level after the reset with φS, φR, respectively, and determining the difference. Since the noise canceller itself is not much related to the essential feature of the present invention, the explanation of the noise canceller is omitted.

As explained above, according to the semiconductor range-finding element of the first embodiment, because the n-type surface buried region 22 is formed, the transfer channel through which the electrons (the signal charges) are transferred is buried in the deep portion, which is close to the interface between the p-type silicon epitaxial growth layer 20 and the n-type surface buried region 22, and the transfer channel is not disposed near the interface between the semiconductor region and the field oxide film 31. Thus, the electrons (the signal charges) are never captured at the interface level. If the electrons (the signal charges) are captured at the interface level, they will be discharged after the elapse of a considerable time, and the response is delayed, which reduces the distance resolution.

Moreover, when the semiconductor range-finding elements according to the first embodiment are arrayed in the shape of the two-dimensional matrix, as shown in FIG. 1, with low cost, a high distance resolution can be achieved, and the structure is simple. Thus, it is possible to achieve a TOF range-finding sensor in which a plurality of pixels are arranged and the space resolution is high. The earlier-developed TOF range-finding sensor has about 20,000 pixels or less. However, in the solid-state imaging device (the TOF range-finding sensor) according to the first embodiment, 320×240 pixels, namely, about 77,000 pixels can be easily manufactured, which can greatly improve the resolution, as compared with the earlier technique.

<Manufacturing Method of Semiconductor Range-Finding Element and Solid-State Imaging Device>

Figure 7:
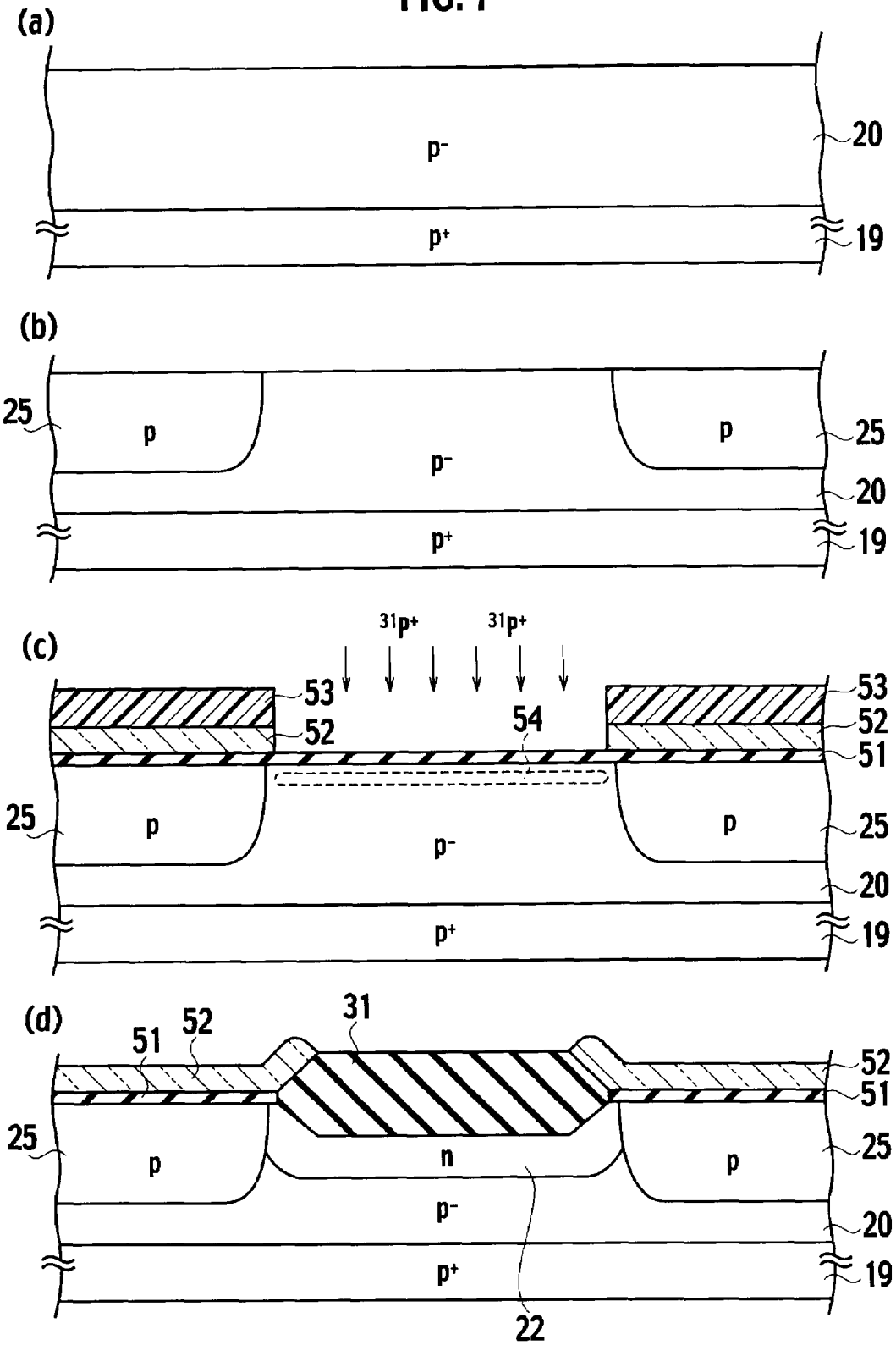
FIG. 7 is a process-flow cross-sectional view (No. 1) describing a manufacturing method of the semiconductor range-finding element and solid-state imaging device, according to the first embodiment of the present invention.
Figure 8:
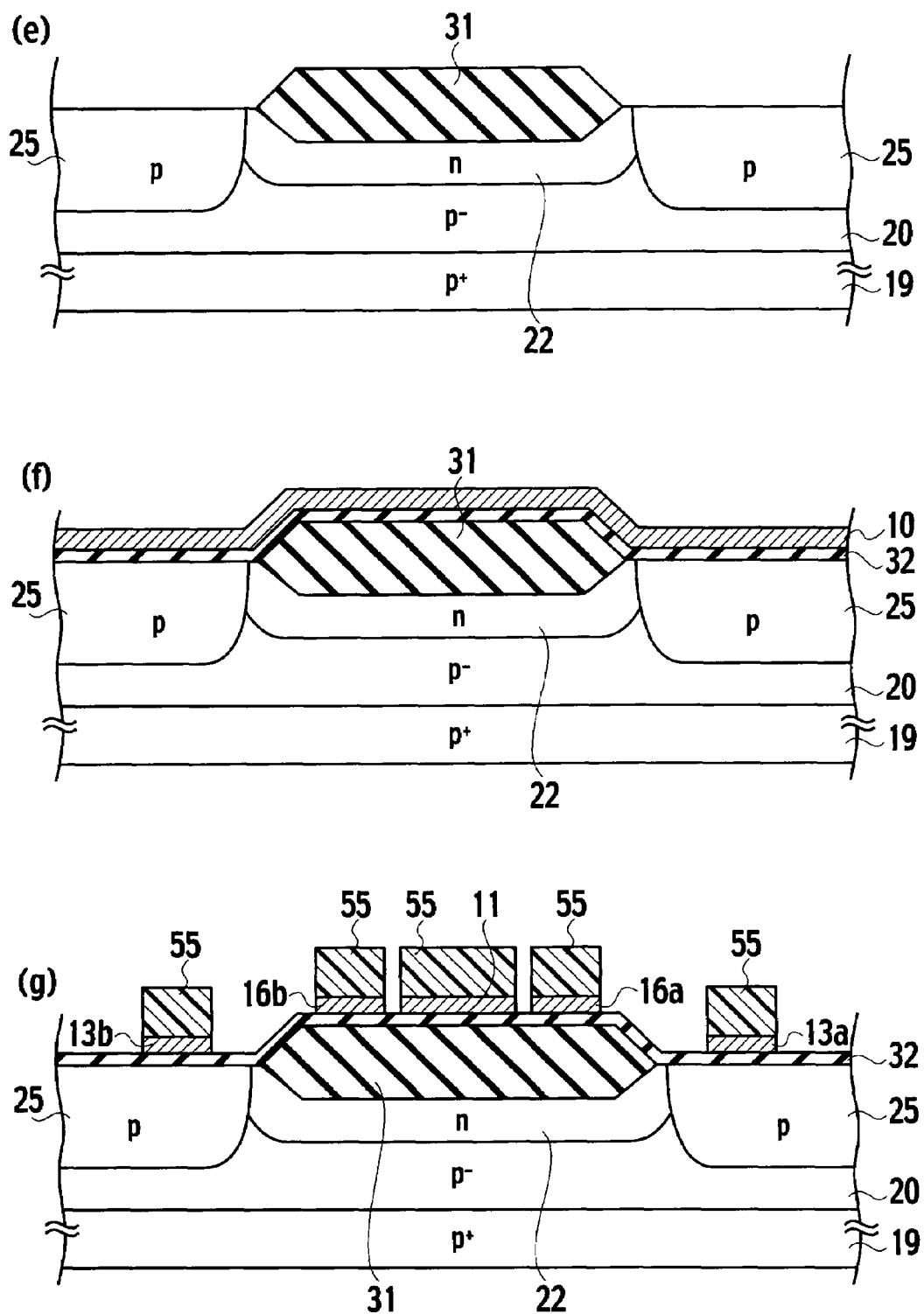
FIG. 8 is a process-flow cross-sectional view (No. 2) describing the manufacturing method of the semiconductor range-finding element and solid-state imaging device, according to the first embodiment of the present invention.

The manufacturing method of the semiconductor range-finding element and solid-state imaging device according to the first embodiment of the present invention will be described below with reference to FIG. 7 to FIG. 9. By the way, the manufacturing method of the semiconductor range-finding element and solid-state imaging device, which will be described below, is one example. It is natural that the various manufacturing methods other than the method described below, including the variation of the method described below can manufacture the semiconductor range-finding element and solid-state imaging device.

(a) At first, as shown in FIG. 7(a), an epitaxial substrate encompassing a p-type semiconductor substrate 19, whose main surface is a (100) plane, of about 0.07 to 0.0012 Ωcm (an impurity concentration is about $8 \times 10^{17}$ cm$^{-3}$ or more and about $1 \times 10^{20}$ cm$^{-3}$ or less) and a p-type silicon epitaxial growth layer 20 grown on the semiconductor substrate 19, the epitaxial growth layer 20 having a thickness of about 4 to 20 μm and an impurity concentration of about $6 \times 10^{13}$ to $1.5 \times 10^{15}$ cm-3 or less is prepared. After the thermally oxidized film (SiO$_2$) of about 150 nm is formed on the main surface of the p-type silicon epitaxial growth layer 20, a photo resist film is coated, and the photo resist film is delineated by a photolithography technique, and a p-well formation region is opened in the photo resist film. Next, boron ions ($^{11}$B$^+$) of a dose amount of about $10^{12}$ to $10^{13}$ cm$^{-2}$ are implanted through the thermally oxidized film into the p-well formation region. Next, the portion of the well formation region of the thermally oxidized film is etched and removed. Also, the photo resist film is removed, and after the completion of a predetermined cleaning step, the implanted boron ions are thermally diffused at about 1200° C., and a p-well 25 is formed as shown in FIG. 7(b). Although the illustration is omitted, another p-wells 25 are formed in the peripheral circuit area and the read-out buffer amplifier 82 assigned in each of the unit pixel $X_{ij}$, at the same time. Also, n-wells are similarly formed in the peripheral circuit area whose illustration is omitted.

(b) Next, after the thermally oxidized film on the main surface of the p-type silicon epitaxial growth layer 20 is removed and stripped all over the surface, a pad oxide film (SiO$_2$) 51 having a film thickness of about 100 nm is again formed on the main surface of the silicon epitaxial growth layer 20, by means of a thermally oxidizing method. After that, the CVD method is used to grow a nitride film (Si$_3$N$_4$) 52 having a film thickness of about 200 nm. A photo resist film 53, which has been delineated by the photolithography technique, is prepared on the nitride film 52. Then, with the delineated photo resist film 53 as a mask, reactive ion etching (RIE) is executed. Then, as shown in FIG. 7(c), phosphorous ions ($^{31}$P$^+$) of a dose amount of about $6 \times 10^{13}$ to $3 \times 10^{11}$ cm$^{-2}$ are implanted into the p-type silicon epitaxial growth layer 20. Then, an ion implanted layer 54 scheduled for the surface buried region is formed on the surface of the p-type silicon epitaxial growth layer 20. On the other hand, although the illustration is omitted, in the peripheral circuit and the read-out buffer amplifiers 82 arranged in each of the unit pixels $X_{ij}$, with the nitride film 52 serving as the mask for channel-stop ion-implantation, the inversion protection impurity ions are implanted so as to generate an inversion protection layer in the element isolation region. Therefore, when the inversion protection impurity ions are implanted into the element isolation region, it is necessary that the inversion protection impurity ions do not enter the ion implanted layer 54 scheduled for the surface buried region shown in FIG. 7(c). Therefore, after the removal of the photo resist film 53, the opening of the nitride film 52 on the upper portion of the ion implanted layer 54 scheduled for the surface buried region shown in FIG. 7(c) is covered with a different photo resist film by the photolithography technique, and the phosphorous ions ($^{31}P^+$) of a dose amount of about $6 \times 10^{14}$ to $2 \times 10^{15}$ cm$^{-2}$ are channel-stop-ion-implanted into only the nMOS formation regions of the peripheral circuit and the read-out buffer amplifier 82. Next, after the removal of the photo resist film, the photolithography technique is used to delineate a new photo resist film, and the boron ions ($^{11}B^+$) are channel-stop-ion-implanted into only the pMOS formation region of the peripheral circuit. After that, the photo resist film is removed.

(c) Next, the LOCOS method is used to form a field oxide film 31 having a thickness of about 150 nm or more, about 1000 nm or less, preferably about 200 nm or more and about 400 nm or less, is formed in the opening of the nitride film 52, as shown in FIG. 7(d). The nitride film 52 covering the element formation region is used as the oxidation protection film because its oxidation rate is extremely slow as compared with silicon. As a result, as shown in FIG. 7(d), the surface buried region 22 is formed on the interface between the field oxide film 31 and the p-type silicon epitaxial growth layer 20. Simultaneously, the p$^+$ inversion protection layer (channel stop region) is formed in the element isolation region surrounding the pMOS formation region in the peripheral circuit, and the n$^+$ inversion protection layer (channel stop region) is formed in the element isolation region surrounding the nMOS formation region of the read-out buffer amplifier 82 and the peripheral circuit. However, those illustrations are omitted.

(d) Next, as shown in FIG. 8(e), after the pad oxide film 51 and the nitride film 52 thereon are removed, a dummy oxide film having a film thickness of about 10 nm is formed on the element formation region. Next, a gate threshold voltage control ($V_{th}$ control) ion-implantation is executed. At first, with the photolithography technique, the p-well 25 in the peripheral circuit is covered with the photo resist film, and the impurity ions for the pMOS gate threshold voltage control are then implanted. Next, after the removal of the photo resist film, the pattern of the photo resist film is formed on the region except the p-well 25 by means of the photolithography technique. In succession, simultaneously with the p-well of the peripheral circuit and the p-well of the read-out buffer amplifier 82, the impurity ions for the nMOS gate threshold voltage control are implanted into the p-well 25 shown in FIG. 8(e). After that, the photo resist film is removed. Moreover, the dummy oxide film used as the protective film for the $V_{th}$ control ion-implantation is stripped.

(e) Next, the surface of the p-well 25 is thermally oxidized to form a gate oxide film 32. Moreover, as shown in FIG. 8(f), on the entire surface on the gate oxide film 32, the CVD method is used to deposit a poly-silicon film 10 between about 200 and 400 nm. Then, a photo resist film 55 delineated by the photolithography technique is prepared on the poly-silicon film 10. Then, with the photo resist film 55 as the mask, as shown in FIG. 8(g), the poly-silicon film 10 is etched by the reactive ion etching (RIE) and the like. Then, the light-receiving gate electrode 11, the first transfer gate electrode 16a, the second transfer gate electrode 16b, the first reset gate electrode 13a and the second reset gate electrode 13b are cut. After that, the photo resist film 55 is removed.

(f) Next, the source/drain regions are formed in the n-well of the peripheral circuit. At first, by using the photolithography technique, the p-well 25 shown in FIG. 9(h), the p-well of the peripheral circuit, the p-well of the read-out buffer amplifier 82, and the first reset gate electrode 13a and second reset gate electrode 13b thereon are covered with a new photo resist film. Then, with the poly-silicon gate electrode of the n-well as the mask, in self-alignment methodology, the boron ions ($^{11}B^+$) are implanted at an order of a dose amount $10^{15}$ cm$^{-2}$. At this time, the boron ions ($^{11}B^+$) are also implanted into the poly-silicon gate electrode of the n-well. Next, after the removal of the photo resist film, by using the photolithography technique, a different photo resist film is covered on the region except the p-well 25. Then, as shown in FIG. 9(h), with the first reset gate electrode 13a and the second reset gate electrode 13b as the mask, by self-alignment methodology, arsenic ions ($^{75}As^+$) are implanted at an order of $10^{15}$ cm-2 into the p-well 25. Simultaneously, arsenic ions ($^{75}As^+$) are similarly implanted, by self-alignment methodology, into the p-well of the peripheral circuit and the p-well of the read-out buffer amplifier 82, with the poly-silicon gate electrode as the mask. At this time, the arsenic ions ($^{75}As^+$) are implanted into the poly-silicon first reset gate electrode 13a and second reset gate electrode 13b and the poly-silicon gate electrode on the p-well of the peripheral circuit whose illustration is omitted. After that, the photo resist film is removed.

(g) Next, the p-type semiconductor substrate 19 is thermally processed. Since the p-type semiconductor substrate 19 is thermally processed, the impurities are diffused, and the p-type source/drain regions are formed in the n-well of the peripheral circuit whose illustration is omitted, and the first floating drain region 23a, the second floating drain region 23b, the first reset source region 24a and the second reset source region 24b are formed in the p-well 25 shown in FIG. 9(i). Similarly, the n-type source/drain regions are formed in the p-well of the peripheral circuit whose illustration is omitted, and the like. At this time, the arsenic ions ($^{75}As^+$), which are implanted into the first reset gate electrode 13a and the second reset gate electrode 13b, are also activated. Thus, the resistances of the first reset gate electrode 13a and second reset gate electrode 13b are decreased. The resistance of the gate electrode of the n-well of the peripheral circuit, whose illustration is omitted, is similarly decreased.

(h) Next, although the illustration is omitted, inter-layer insulating films are deposited in order to insulate between the vertical signal line and horizontal scanning line to connect the respective pixels, or the metallic wiring layer for the connection between the respective transistors in the peripheral circuit and the portion between the poly-silicon films implementing the gate electrode. As the inter-layer insulating film, it is possible to use the various dielectric films, such as the composite film implemented by the double-layer structure of the oxide film (CVD-SiO$_2$) that is deposited by the CVD method and has a film thickness of about 0.5 µm; and the PSG film or BPSG film that is deposited on the oxide film (CVD-SiO$_2$) by means of the CVD method and has a film thickness of about 0.5 µm. After the deposition by means of the CVD method, the PSG film or BPSG film is thermally processed. Thus, the BPSG film in the upper layer of the composite film is reflowed, and the surface of the inter-layer insulating film is made flat. On the surface, the photo resist film delineated by the photolithography technique is used as the mask, and the inter-layer insulating film is etched by the RIE or ECR ion-etching and the like, and a contact hole to connect the metallic wiring layer and the transistor is formed. After that, the photo resist film used to form the contact hole is removed. Next, a sputtering method or electron beam vacuum evaporation method or the like is used to form the aluminum alloy film (Al—Si, Al—Cu—Si) including silicon and the like. Thereon, the photolithography technique is used to delineate a mask by the photo resist film, and by using the delineated photo resist film as a mask, the aluminum alloy film is delineated by the RIE. Such sequential processes are sequentially repeated. Consequently, the vertical signal line and horizontal scanning line to connect the respective pixels, or the metallic wiring layers to connect between the respective transistors in the peripheral circuit are formed. Moreover, a different interlayer insulating film is formed on the metallic wiring layer, and the photolithography technique is used to form the metallic film having the opening 42 directly over the light-receiving gate electrode 11 of each pixel, and the metallic film serves as the light shielding film 41. Then, when the passivation film having a film thickness of about 1 µm, which is intended to protect the mechanical damage and protect the immersion of the water and the impurities, is laminated on the light shielding film 41 by means of the CVD method, the solid-state imaging device according to the first embodiment of the present invention is completed. The PSG film, the nitride film and the like are used in the passivation film.

As mentioned above, according to the manufacturing method of the semiconductor range-finding element and solid-state imaging device according to the first embodiment of the present invention, the formation of the surface buried region 22 can be facilitated by forming the surface buried region 22, through the ion-implantation and the like, as an extra step to the manufacturing procedure of the standard CMOS image sensor. Thus, the semiconductor range-finding element and solid-state imaging device according to the first embodiment of the present invention can be manufactured by adding the easy step. Although the n-type surface buried region 22 is formed to contact with the first floating drain region 23a and the second floating drain region 23b on the right and left side, the first floating drain region 23a and the second floating drain region 23b can be formed simultaneously with the source and drain regions of the nMOS transistor, as mentioned above, and the addition of the special step is not required.

In this way, according to the manufacturing method of the semiconductor range-finding element and solid-state imaging device according to the first embodiment of the present invention, while the standard CMOS process is basic, only with the addition of the step for forming the n-type surface buried region 22 configured to detect light and to serve as the transfer channel, which transfers the signal charges, the TOF range-finding sensor by which a high speed signal transfer can be achieved similarly to the CCD can be manufactured by the standard CMOS process.

Second Embodiment

The entire organization of the solid-state imaging device (two-dimensional image sensor) according to the second embodiment of the present invention is equivalent to the block diagram shown in FIG. 1. Thus, the overlapping or redundant description is omitted. Also, the planar configuration of the semiconductor range-finding element serving as the TOF pixel circuit 81 assigned in each of the pixels $X_{11}$ to $X_{1m}$, $X_{21}$ to $X_{2m}$, ..., $X_{n1}$ to $X_{nm}$ in the solid-state imaging device according to the second embodiment is similar to FIG. 2, which has been shown as one example of the planar configuration of the semiconductor range-finding element according to the first embodiment. Hence, the overlapping or redundant description is omitted.

Figure 10:
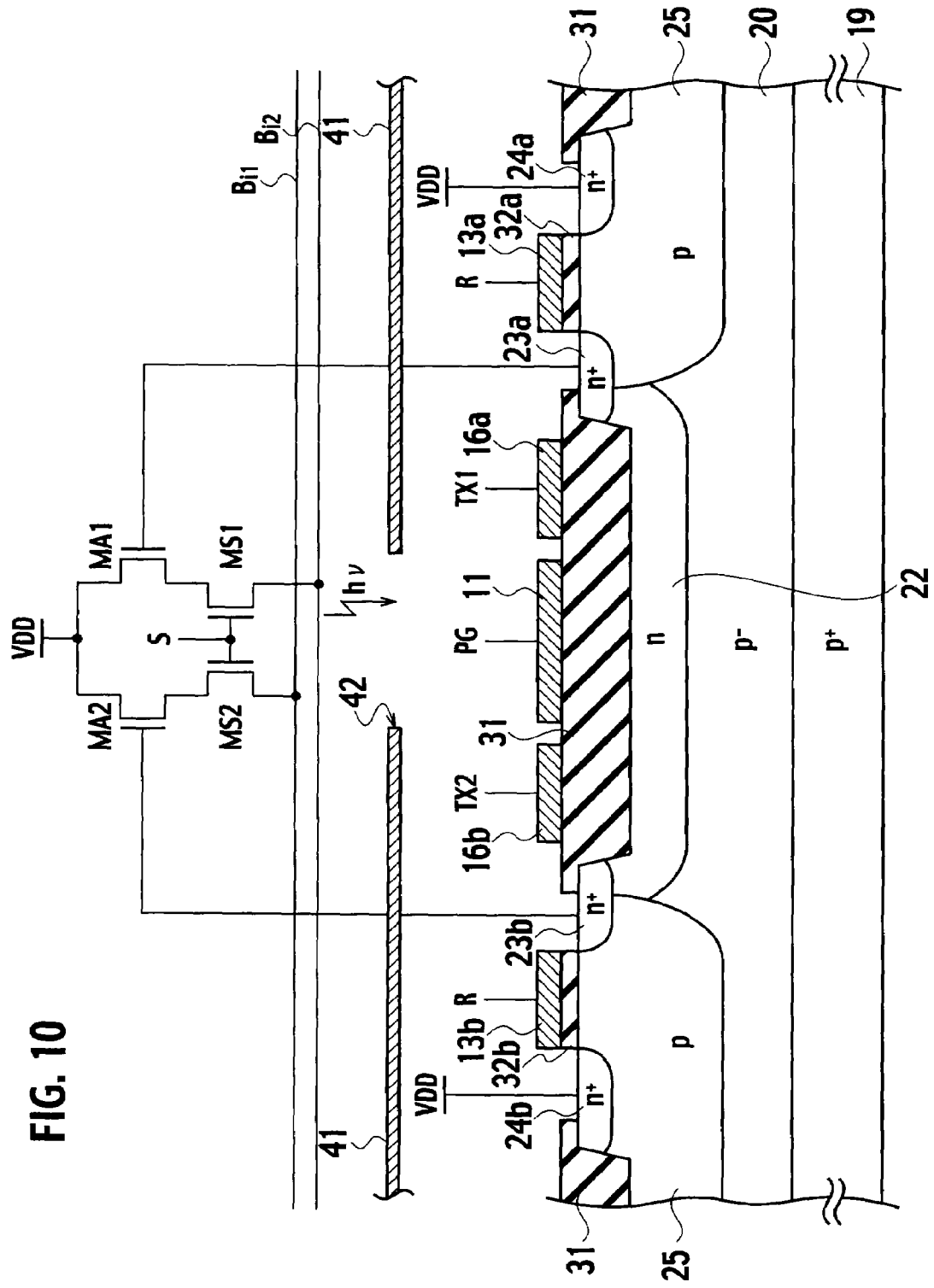
FIG. 10 is a diagrammatic cross-sectional view explaining a schematic configuration of a semiconductor range-finding element serving as a part of pixels in a solid-state imaging device according to a second embodiment of the present invention.

FIG. 10 is the cross-sectional structure of the semiconductor range-finding element, which has been shown in FIG. 2. Similarly to the semiconductor range-finding element according to the first embodiment, the structure embraces a semiconductor substrate 19 of the first conductivity type (p-type); a semiconductor layer (epitaxial growth layer) 20 of the first conductivity type (p-type) arranged on the semiconductor substrate 19; and a surface buried region 22 of the second conductivity type (n-type) that is arranged on the semiconductor layer (epitaxial growth layer) 20, as the basic structure. An insulating film 31 directly under the central light-receiving gate electrode 11, the surface buried region 22, the semiconductor layer (epitaxial growth layer) 20 and the semiconductor substrate 19 implement the semiconductor photoelectric conversion element. The features that a part of the semiconductor layer (epitaxial growth layer) 20 of the first conductivity type (p-type) which is located directly under the light-receiving gate electrode 11 serves as the charge generation region of the semiconductor photoelectric conversion element and that the carriers (electrons) generated in the charge generation region are injected into a sub-area of the surface buried region 22 directly over the charge generation region are similar to the semiconductor range-finding element according to the first embodiment.

However, in the semiconductor range-finding element according to the first embodiment, the structure in which the insulating film (field oxide film) 31 is formed by the LOCOS method is exemplified. However, the cross-sectional structure shown in FIG. 10 is different in that a shallow trench isolation (STI) architecture is used in the element isolation architecture. Similarly to the semiconductor range-finding element according to the first embodiment, the insulating film 31 extends from directly under the light-receiving gate electrode 11 to under the first transfer gate electrode 16a and the second transfer gate electrode 16b on the right and left sides, and below the insulating film 31, the surface buried region 22 is buried to extend from directly under the light-receiving gate electrode 11 to under the first transfer gate electrode 16a and the second transfer gate electrode 16b in the right and left directions. Then, the features that, in the surface buried region 22 adjacent to the right side of the surface buried region 22 directly under the light-receiving gate electrode 11 (directly over the charge generation region), the site located directly under the first transfer gate electrode 16a serves as the first transfer channel and that, in the surface buried region 22 adjacent to the left side of the surface buried region 22 directly under the light-receiving gate electrode 11, the site located directly under the second transfer gate electrode 16b serves as the second transfer channel, and the other features and their functions and the operations as the semiconductor range-finding element and the like do not essentially differ from the semiconductor range-finding element according to the first embodiment described by using FIG. 1 to FIG. 6. Thus, the overlapping or redundant description is omitted.

Thus, in the semiconductor range-finding element according to the second embodiment, similarly to the semiconductor range-finding element according to the first embodiment, the surface buried region 22 is formed and consequently, the transfer channel through which the electrons (the signal charges) are transferred is buried in the deep portion close to the interface between the p-type silicon epitaxial growth layer 20 and the n-type surface buried region 22, and the transfer channel is not disposed near the interface between the semiconductor region and the insulating film 31. Hence, the semiconductor range-finding element according to the second embodiment similarly provides the effectiveness such that the electrons (the signal charges) are never captured at the interface level.

Then, when the semiconductor range-finding elements according to the second embodiment are arrayed in the shape of the two-dimensional matrix shown in FIG. 1, the TOF range-finding sensor, implemented by a simple structure, having a high distance resolution and a high distance resolution is manufactured with a low cost. These features are similar to the solid-state imaging device according to the first embodiment.

<Manufacturing Method of Semiconductor Range-Finding Element and Solid-State Imaging Device>

Figure 11:
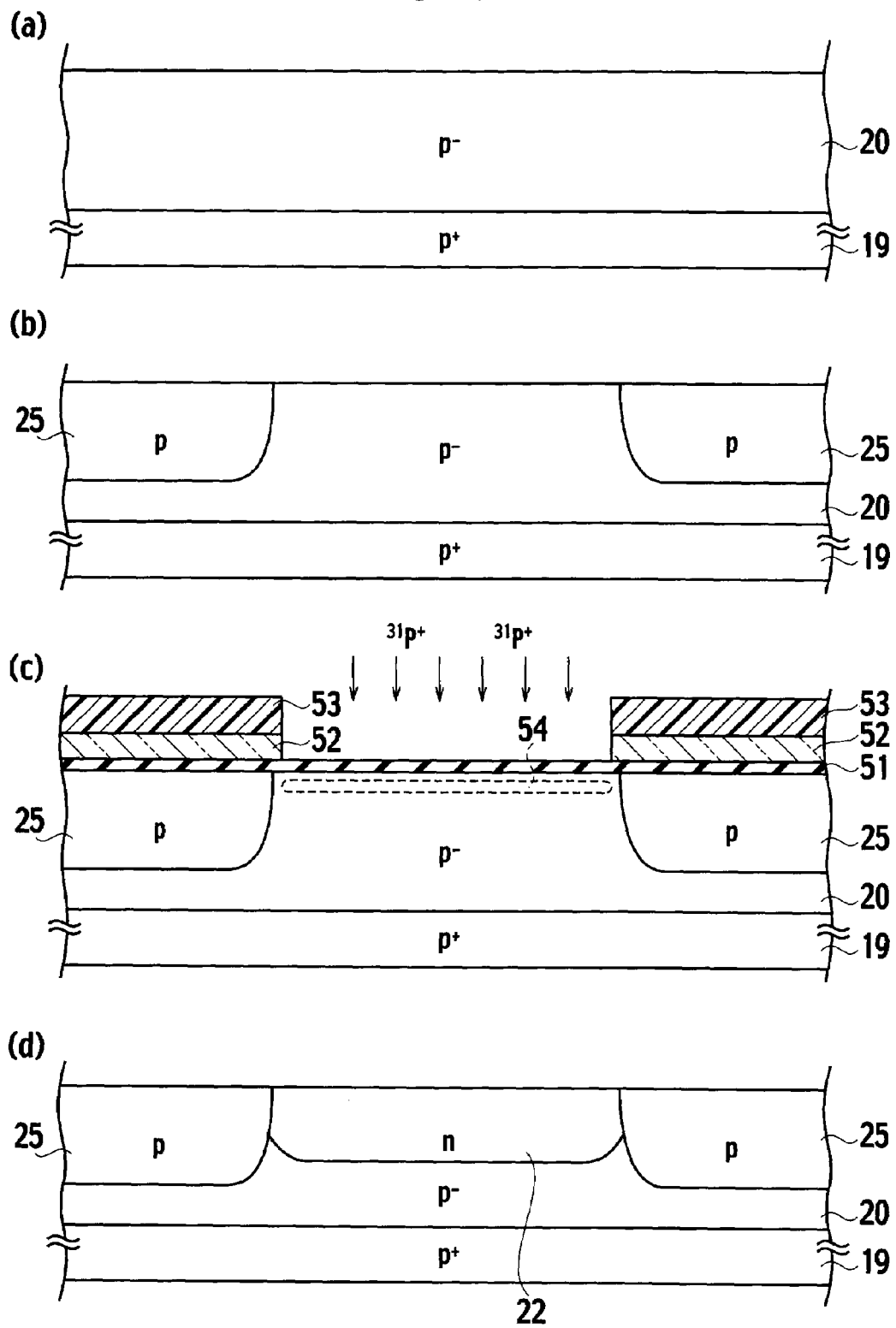
FIG. 11 is a process-flow cross-sectional view (No. 1) describing a manufacturing method of the semiconductor range-finding element and solid-state imaging device, according to the second embodiment of the present invention.
Figure 12:
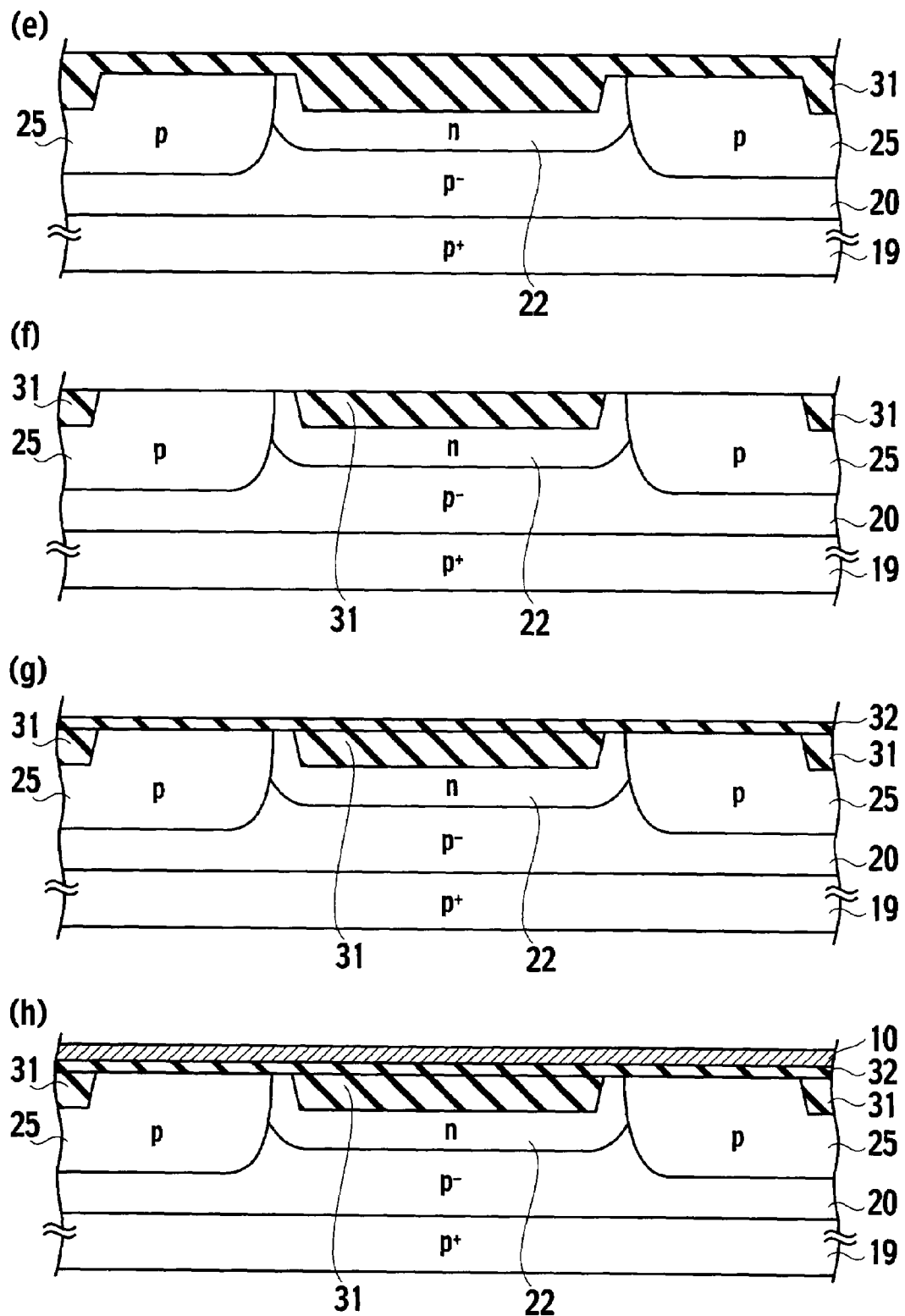
FIG. 12 is a process-flow cross-sectional view (No. 2) describing the manufacturing method of the semiconductor range-finding element and solid-state imaging device, according to the second embodiment of the present invention.
Figure 13:
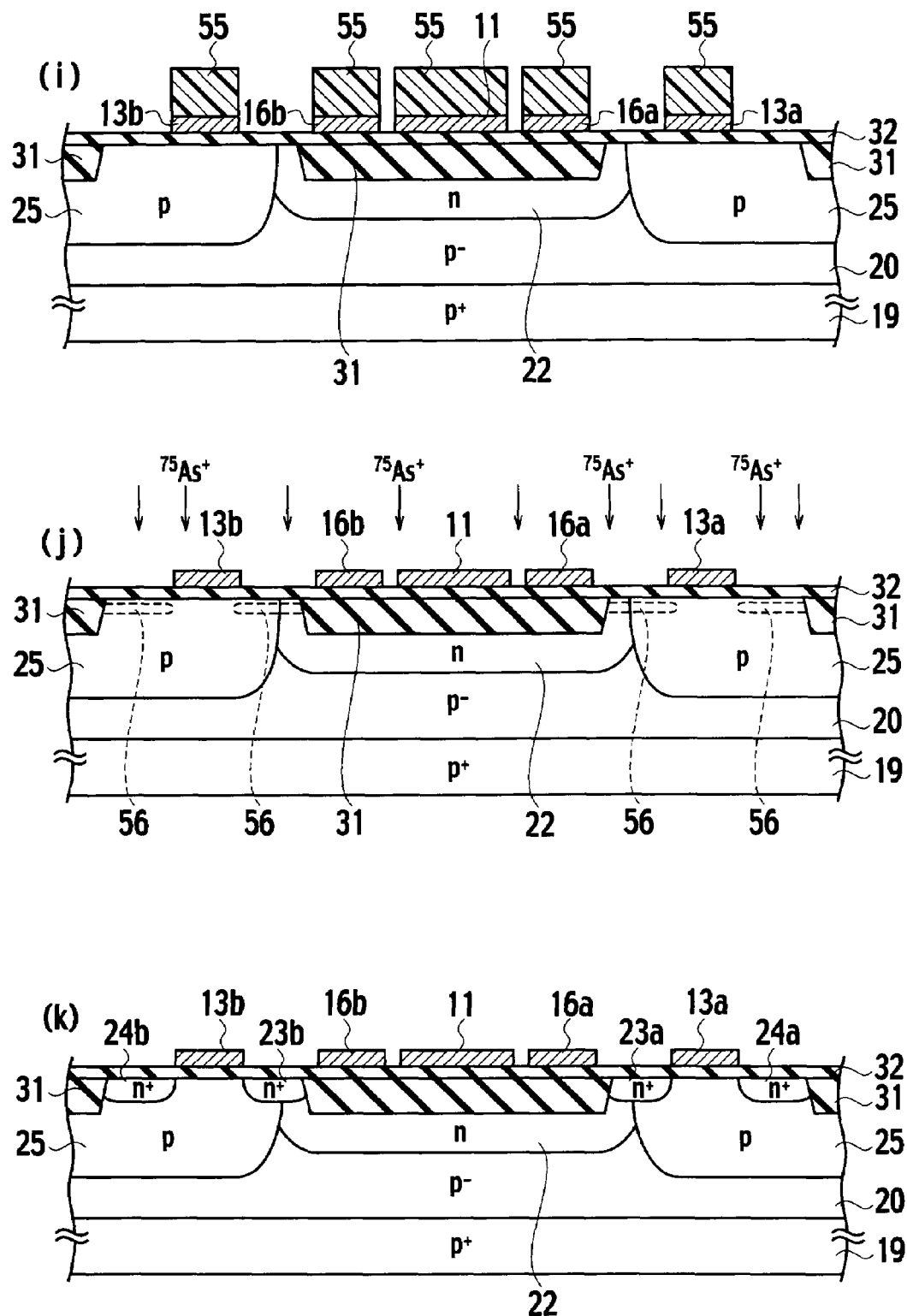
FIG. 13 is a process-flow cross-sectional view (No. 3) describing the manufacturing method of the semiconductor range-finding element and solid-state imaging device, according to the second embodiment of the present invention.

The manufacturing method of the semiconductor range-finding element and solid-state imaging device according to the second embodiment of the present invention will be described below by using FIG. 11 to FIG. 13. However, the manufacturing method of the second embodiment has the steps common to the manufacturing method of the semiconductor range-finding element and solid-state imaging device according to the first embodiment indicated in FIG. 7 to FIG. 9.

(a) A sequence of steps such that, at first, as shown in FIG. 11(a), an epitaxial substrate, in which a p-type silicon epitaxial growth layer 20 is formed on a p-type semiconductor substrate 19, is prepared; as shown in FIG. 11(b), p-well 25 is formed; a nitride film ($Si_3N_4$) 52 is grown through the pad oxide film 51 on the main surface of the p-type silicon epitaxial growth layer 20, the nitride film 52 is processed by the RIE with the photo resist film 53 delineated by the photolithography technique as the mask; as shown in FIG. 11(c), the phosphorous ions ($^{31}P^+$) are implanted into the p-type silicon epitaxial growth layer 20; and then, the ion implanted layer 54 scheduled for the surface buried region is formed on the surface of the p-type silicon epitaxial growth layer 20 is perfectly similar to the manufacturing method of the semiconductor range-finding element and solid-state imaging device according to the first embodiment shown in FIG. 7(a) to FIG. 7(c).

(b) In the manufacturing method of the semiconductor range-finding element and solid-state imaging device according to the second embodiment, after the formation of the ion implanted layer 54 scheduled for the surface buried region, the photo resist film is removed, and after the completion of the predetermined cleaning step, the annealing process is carried out between about 1100° C. and 1150° C., and the implanted phosphorous ions ($^{31}P^+$) are thermally diffused, and the surface buried region 22 is then formed as shown in FIG. 11(d). Simultaneously, the $p^+$ inversion-protecting layer (channel stop layer) is formed in the element isolation region surrounding the pMOS formation region of the peripheral circuit, and the $n^+$ inversion-protecting layer (channel stop layer) is formed in the element isolation region surrounding the nMOS formation region of the read-out buffer amplifier 82 and the peripheral circuit. However, those illustrations are omitted.

(c) Next, the new thermally oxidized film ($SiO_2$) between about 250 nm and 500 nm is grown on the entire surface of the main surface of the p-type silicon epitaxial growth layer 20, including the surface of the p-well 25 and the surface of the surface buried region 22. Moreover, after that, the photo resist film is coated, and the photo resist film is delineated by the photolithography technique, and the etching mask (first etching mask) for the element isolation trench formation is formed. With the photo resist film as the mask, the thermally oxidized film ($SiO_2$) is etched by the RIE. Then, the photo resist film is removed, and the etching mask (second etching mask) for the element isolation trench formation that is made of the thermally oxidized film ($SiO_2$) is formed. By using the etching mask for the element isolation trench formation made of the thermally oxidized film ($SiO_2$), on the surface of the surface buried region 22, the element isolation trench having a depth of about 150 nm or more and 1000 nm or less, preferably, about 200 nm or more and 700 nm or less is grooved by the RIE. Although the illustration is omitted, the element isolation trench is similarly formed in the element isolation regions in the peripheral circuit and the read-out buffer amplifier 82. Moreover, the CVD method is used to deposit the insulating film 31 on the entire surface so that the insulating film 31 becomes thicker by 50 to 100 nm than the depth of the element isolation trench, as shown in FIG. 12(e), and the element isolation trench is perfectly filled. Moreover, with a chemical mechanical polishing (CMP), the p-well 25 is polished until its surface exposed. Then, as shown in FIG. 12(f), the insulating film 31 is buried in the element isolation trench. Although the illustration is omitted, similarly in the element isolation regions in the peripheral circuit and the read-out buffer amplifier 82, the insulating film 31 is buried in the element isolation trench, and the insulating film 31 serves as the field oxidization film.

(d) Next, after the gate threshold voltage control ($V_{th}$ control) ion-implantation is executed, as shown in FIG. 12(g), the surface of the p-well 25 is thermally oxidized, and the gate oxide film 32 is formed. Moreover, as shown in FIG. 12(h), the poly-silicon film 10 is deposited on the entire surface on the gate oxide film 32 by the CVD method. Then, with the photo resist film 55 as the mask, as shown in FIG. 13(i), the poly-silicon film 10 is etched by the reactive ion etching (RIE) and the like. Then, the light-receiving gate electrode 11, the first transfer gate electrode 16a, the second transfer gate electrode 16b, the first reset gate electrode 13a and the second reset gate electrode 13b are formed. These steps are basically similar to the manufacturing method of the semiconductor range-finding element and solid-state imaging device, according to the first embodiment shown in FIGS. 8(f) to (g).

(e) Moreover, as shown in FIG. 13(j), with the first reset gate electrode 13a and the second reset gate electrode 13b as the mask, by self-alignment methodology, the arsenic ions ($^{75}As^+$) are implanted into the p-well 25, and the semiconductor substrate 19 is thermally heated. Then, the first floating drain region 23a, the second floating drain region 23b, the first reset source region 24a and the second reset source region 24b are formed in the p-well 25 shown in FIG. 13(k). The foregoing sequence of process steps is basically similar to the sequence of process steps of the manufacturing method of the semiconductor range-finding element and solid-state imaging device, according to the first embodiment shown in FIGS. 9(h) to (i). After that, the multi-level wiring step for providing the vertical signal line and horizontal scanning line to connect the respective pixels, or the metal wiring layer for the connection between the respective transistors in the peripheral circuit, and the passivation step are respectively executed, which are basically similar to the steps in the manufacturing method of the semiconductor range-finding element and solid-state imaging device, according to the first embodiment. Thus, their overlapping or redundant description is omitted.

As mentioned above, according to the manufacturing method of the semiconductor range-finding element and solid-state imaging device according to the second embodiment of the present invention, the formation of the surface buried region 22 can be facilitated by forming the surface buried region 22, through the ion-implantation and the like, as an extra step to the manufacturing procedure of the standard CMOS image sensor having the STI structure. Thus, the semiconductor range-finding element and solid-state imaging device according to the second embodiment can be manufactured by adding the easy step. Although the n-type surface buried region 22 is formed to contact with the first floating drain region 23a and the second floating drain region 23b on the right and left side, the first floating drain region 23a and the second floating drain region 23b can be formed simultaneously with the source and drain regions of the nMOS transistor, as mentioned above, and the addition of the special step is not required.

In this way, according to the manufacturing method of the semiconductor range-finding element and solid-state imaging device according to the second embodiment of the present invention, while the standard CMOS process is basic, only with the addition of the step for forming the n-type surface buried region 22 configured to detect light and to serve as the transfer channel, which transfers the signal charges, the TOF range-finding sensor by which a high speed signal transfer can be achieved similarly to the CCD can be manufactured by the standard CMOS process.

Another Embodiment

While the present invention is described in accordance with the aforementioned first and second embodiments, it should not be understood that the description and drawings that implement a part of the disclosure are to limit the scope of the present invention. This disclosure makes clear a variety of alternative embodiments, examples and operational techniques for those skilled in the art.

Figure 15:
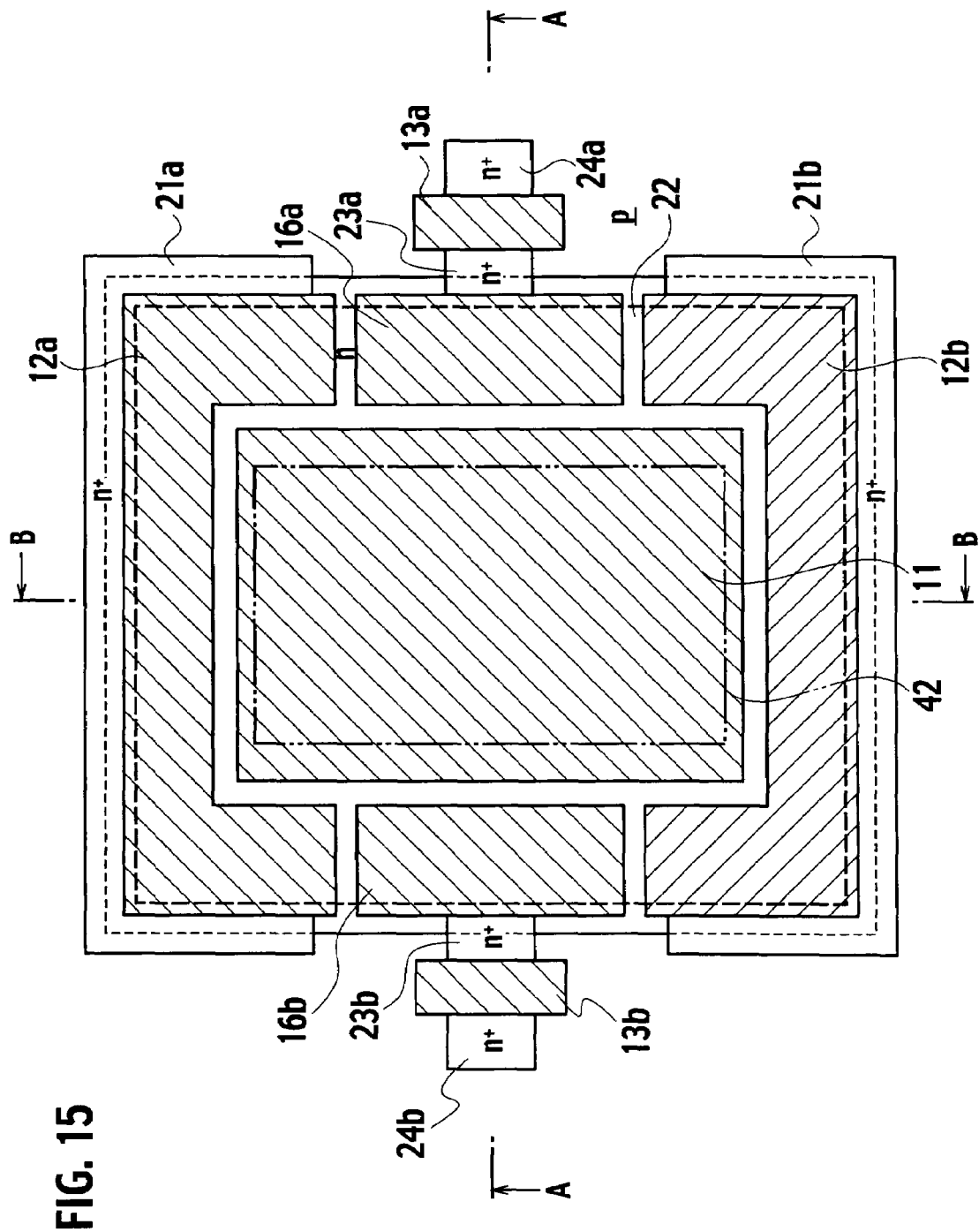
FIG. 15 is a schematic plan view describing a configuration of a semiconductor range-finding element serving as a part of pixels in a solid-state imaging device according to another embodiment of the present invention.

For example, in the plan view of the solid-state imaging device according to the first embodiment shown in FIG. 2, the first exhausting gate electrode 12a and the second exhausting gate electrode 12b, which are U-shaped, may be added so as to be oppositely arranged, along the direction orthogonal to the transfer direction of the signal charges, as shown in FIG. 15. In FIG. 15, in such a way that the signal charges generated by the semiconductor range-finding element are transferred to the directions opposite to each other (the right and left directions), on the planar pattern, the respective central lines (not shown) of the first transfer gate electrode 16a and the second transfer gate electrode 16b are aligned on the same straight line A-A, horizontally (in the right and left direction) in FIG. 15. Then, the respective widths of the first transfer gate electrode 16a and the second transfer gate electrode 16b, which are measured in the direction orthogonal to the transfer direction of the signal charges (the upper and lower direction in FIG. 15) are made narrower than the width of the light-receiving gate electrode 11 that is measured in the orthogonal direction. Thus, even if the area of the light-receiving region directly under the light-receiving gate electrode 11 is made large, the perfect transfers of the signal charges that are carried out by the first transfer gate electrode 16a and the second transfer gate electrode 16b can be executed. As shown in FIG. 15, on the planar pattern, the respective central lines (not shown) of the first exhausting gate electrode 12a and the second exhausting gate electrode 12b are aligned on the same straight line B-B in the vertical direction (the upper and lower direction) in FIG. 15. The first exhausting gate electrode 12a exhausts the background charges, which are generated in the charge generation region by the background light, to the upper direction of FIG. 15, and the second exhausting gate electrode 12b exhausts the background charges, which are generated in the charge generation region by the background light, to the lower direction of FIG. 15. The background charges exhausted by the first exhausting gate electrode 12a are received by a first exhausting drain region 21a allocated at upper direction of FIG. 15, and the background charges exhausted by the second exhausting gate electrode 12b are received by a second exhausting drain region 21b allocated at lower direction of FIG. 15.

Figure 16:
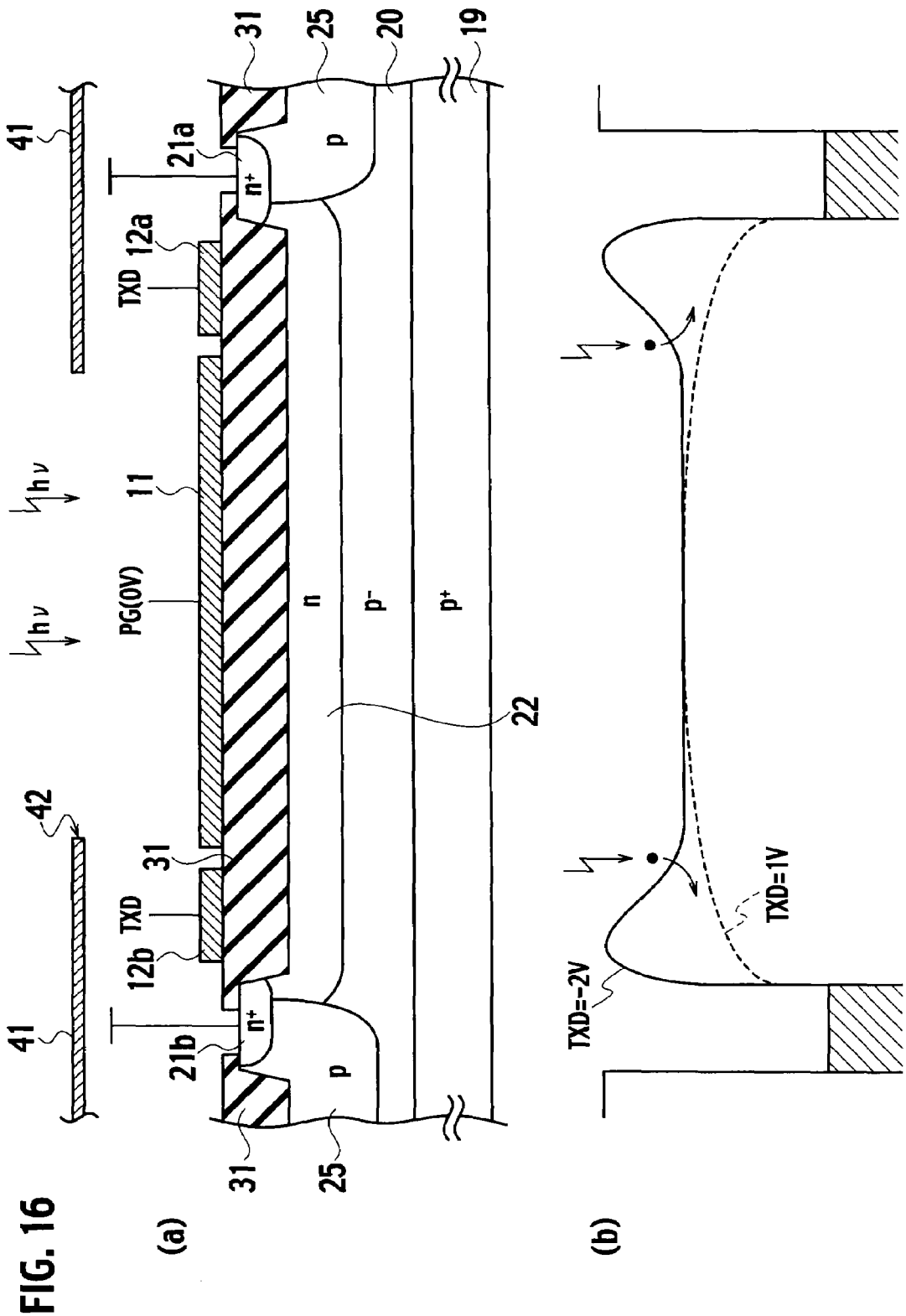
FIG. 16 is a diagrammatic plan view when viewed from the B-B direction of FIG. 15.

Since the cross-sectional structure viewed from the A-A direction of the semiconductor range-finding element, which has been shown in FIG. 15 is similar to FIG. 3 described in the first embodiment, the overlapping or redundant description is omitted. However, FIG. 16 is the cross-sectional structure viewed from the B-B direction of the semiconductor range-finding element, which has been shown in FIG. 15 and shows the semiconductor substrate 19 of the first conductivity type (p-type), the semiconductor layer (epitaxial growth layer) 20 of the first conductivity type (p-type) arranged on the semiconductor substrate 19, and the surface buried region 22 of the second conductivity type (n-type) arranged on the semiconductor layer (epitaxial growth layer) 20. The features that the insulating film 31 directly under the central light-receiving gate electrode 11, the surface buried region 22, the semiconductor layer (epitaxial growth layer) 20 and the semiconductor substrate 19 implement the semiconductor photoelectric conversion element, and that the part of the semiconductor layer (epitaxial growth layer) 20 of the first conductivity type (p-type) which is located directly under the light-receiving gate electrode 11 serves as the charge generation region of the semiconductor photoelectric conversion element, and that the carriers (electrons) generated in the charge generation region are injected into the sub-area of the surface buried region 22 directly over the charge generation region are as described in FIG. 3.

The insulating film 31 extends from directly under the light-receiving gate electrode 11 to under the first exhausting gate electrode 12a and the second exhausting gate electrode 12b in the right and left portions of FIG. 16 (corresponding to the upper and lower directions of FIG. 15). Below the insulating film 31, the surface buried region 22 is buried to extend from directly under the light-receiving gate electrode 11 to under the first exhausting gate electrode 12a and the second exhausting gate electrode 12b in the right and left directions. That is, in the surface buried region (another sub-area of the surface buried region 22) 22 adjacent to the right side of the surface buried region 22 directly under the light-receiving gate electrode 11 (directly over the charge generation region), the site located directly under the first exhausting gate electrode 12a serves as the first exhausting channel. On the other hand, in the surface buried region (a still another sub-area of the surface buried region 22) 22 adjacent to the left side of the surface buried region 22 directly under the light-receiving gate electrode 11 (directly over the charge generation region), the site located directly under the second exhausting gate electrode 12b serves as the second exhausting channel. Then, the first exhausting gate electrode 12a and the second exhausting gate electrode 12b electrostatically control the potentials of the first and second exhausting channels through the insulating films 31 formed on those first and second exhausting channels, respectively, and transfer the background charges through the first and second exhausting channels to the first floating drain region 23a and the second floating drain region 23b of the second conductivity type (n-type), respectively. Each of the first floating drain region 23a and the second floating drain region 23b is the semiconductor region of the higher impurity concentration than the surface buried region 22. As evident from FIG. 16, the surface buried region 22 is formed to contact with the first floating drain region 23a and the second floating drain region 23b in the right and left portions.

In another embodiment of the present invention, in addition to the structure of transferring the signal charges $Q_1$, $Q_2$ described in the first embodiment, in order to remove the influence of the background light, the first exhausting gate electrode 12a and the second exhausting gate electrode 12b are provided in the upper and lower directions of the plan view in FIG. 15. That is, the background charges are exhausted through the first exhausting gate electrode 12a and the second exhausting gate electrode 12b to the first exhausting drain region 21a and the second exhausting drain region 21b, which serve as the exhausting outlets. Control pulse signals TXD are applied to the first exhausting gate electrode 12a and the second exhausting gate electrode 12b on the upper and lower portions. The pulse widths of the control pulse signals TXD that are applied to the first exhausting gate electrode 12a and the second exhausting gate electrode 12b may be made longer than the pulse widths of the control pulse signals TX1, TX2 that are applied to the first transfer gate electrode 16a and the second transfer gate electrode 16b. That is, in the period while the optical pulse is not irradiated, the potential of the control pulse signal TXD is made high, and the background charges generated by the background light are exhausted to the first exhausting drain region 21a and the second exhausting drain region 21b.

FIG. 16 shows their operations. When the control pulse signal TX1 is applied to the first transfer gate electrode 16a and the control pulse signal TX2 is applied to the second transfer gate electrode 16b so that the signal charges are divided into the right and left portions, a negative voltage (for example, TXD=−2 V) is applied to the first exhausting gate electrode 12a and the second exhausting gate electrode 12b, and a potential barrier is generated as indicated by a solid line in FIG. 16 so that the charges are not transferred to the first exhausting drain region 21a and the second exhausting drain region 21b.

On the other hand, when the background charges are required to be exhausted, as indicated by a broken line in FIG. 16, a high potential (for example, 1 V) is applied to the first exhausting gate electrode 12a and the second exhausting gate electrode 12b so that the transfer of the background charges to the first exhausting drain region 21a and the second exhausting drain region 21b is made easy.

By the way, the applying method of the voltage shown in FIG. 16 is intended for the exemplification. The voltages TXD, which are applied to the first exhausting gate electrode 12a and the second exhausting gate electrode 12b on the right and left sides in FIG. 16, are not especially required to be equal, and the background charges can be exhausted even when the ±voltage is alternately added. Also, as shown in FIG. 16, even when the same positive voltage is applied, the background charges can be discharged. That is, the flexible applying methodologies of various voltages can be performed on the voltages TXD that are applied to the first exhausting gate electrode 12a and the second exhausting gate electrode 12b on the right and left sides in FIG. 16. Thus, applying the various voltages can effectively remove the influence of the background charges.

As mentioned above, according to the semiconductor range-finding element according to another embodiment, the predetermined voltage is applied to the first exhausting gate electrode 12a and the second exhausting gate electrode 12b, and the background charges are transferred to the first exhausting drain region 21a and the second exhausting drain region 21b. Thus, the influence of the background light can be suppressed. If the background light is included in the signal, because of the existence of the shot noise in the light, when there are the background charges, the shot noise leads to the drop in a range measurement precision. However, according to the semiconductor range-finding element according to another embodiment, the background charges can be effectively removed, thereby achieving a high range measurement precision (distance resolution) and the maximum range measurement coverage.

Also, in the description of the first and second embodiments as mentioned above, the TOF range-finding sensor as the two-dimensional solid-state imaging device (area sensor) has been exemplified. However, the semiconductor range-finding element of the present invention should not be limitedly construed to be used only for the pixel of the two-dimensional solid-state imaging device.

For example, in the two-dimensional matrix shown in FIG. 1, as the pixel of the one-dimensional solid-state imaging device (line sensor) in which j=m=1 is defined, the organization in which the plurality of semiconductor range-finding elements may be one-dimensionally arrayed must be easily understood from the above-mentioned disclosed contents.

As such, the present invention may naturally include various embodiments not described herein. Therefore, the technical scope of the present invention should be defined only by features for specifying the invention according to the appended claims that are regarded appropriate according to the above description.

INDUSTRIAL APPLICABILITY

According to the present invention, it is possible to provide the semiconductor range-finding element in which the high speed charge transfer can be carried out, and the solid-state imaging device that uses the semiconductor range-finding element as the pixels, which is manufactured at lower cost, and having a high distance resolution and a high space resolution. Thus, the semiconductor range-finding element of the present invention can be applied to the field of a range-finding sensor for a car and the field to obtain or prepare a three-dimensional picture. Moreover, the solid-state imaging device of the present invention can be applied even to the fields for analyzing movement of a sport player and the game machine in which the three-dimensional picture is used.

The invention claimed is:

1. A semiconductor range-finding element, comprising:
a semiconductor photoelectric conversion element comprising:
    a charge generation region of a first conductivity type, and
    a part of a surface buried region of a second conductivity type of an opposite conductivity type to the first conductivity type disposed on the charge generation region,
    configured to receive an optical pulse, which is reflected by a target sample, and configured to convert the optical pulse into signal charges in the charge generation region;
first and second transfer gate electrodes configured to electrostatically control potentials of first and second transfer channels implemented by another part of the surface buried region adjacent to the part of the surface buried region directly over the charge generation region, through insulating films formed on the first and second transfer channels, respectively, and configured to alternately transfer the signal charges through the first and second transfer channels; and
first and second floating drain regions configured to accumulate the signal charges transferred by the first and second transfer gate electrodes, sequentially and respectively, having the second conductivity type and a higher impurity concentration than the surface buried region,
wherein, by sequentially applying pulse signals to the first and second transfer gate electrodes in synchronization with the optical pulse so as to operate the first and second transfer gate electrodes, a range to the target sample is measured, in accordance with a distribution ratio between the charges accumulated in the first and second floating drain regions.

2. The semiconductor range-finding element according to claim 1, wherein the charge generation region has the first conductivity type and is implemented by a part of a semiconductor layer provided on a semiconductor substrate, the semiconductor substrate having a higher impurity concentration than the charge generation region.

3. The semiconductor range-finding element according to claim 1, wherein the charge generation region has the first conductivity type and is implemented by a part of an epitaxial growth layer grown on a semiconductor substrate, the semiconductor substrate having a higher impurity concentration than the charge generation region.

4. The semiconductor range-finding element according to claim 2, wherein:
the semiconductor substrate has an impurity concentration of $4 \times 10^{17}$ cm$^{-3}$ or more and $1 \times 10^{21}$ cm$^{-3}$ or less; and
the charge generation region has an impurity concentration of $6 \times 10^{11}$ cm$^{-3}$ or more and $2 \times 10^{15}$ cm$^{-3}$ or less.

5. The semiconductor range-finding element according to claim 2, wherein:
the semiconductor substrate is a silicon substrate having an impurity concentration of $4 \times 10^{17}$ cm$^{-3}$ or more and $1 \times 10^{21}$ cm$^{-3}$ or less; and
the charge generation region is a silicon epitaxial growth layer having an impurity concentration of $6 \times 10^{11}$ cm$^{-3}$ or more and $2 \times 10^{15}$ cm$^{-3}$ or less.

6. The semiconductor range-finding element according to claim 1, wherein the semiconductor photoelectric conversion element further comprises:
a part of the insulating films extending to a site on the surface buried region, the site allocated directly over the charge generation region; and
a light-receiving gate electrode on an insulating film, directly over the charge generation region.

7. The semiconductor range-finding element according to claim 6, wherein the signal charges are transferred to directions opposite to each other, on a planar pattern, and respective central lines of the first transfer gate electrode and the second transfer gate electrode are aligned on a same straight line.

8. The semiconductor range-finding element according to claim 7, wherein respective widths of the first and second transfer gate electrodes measured in a direction orthogonal to a transfer direction of the signal charges are narrower than a width of the light-receiving gate electrode measured in the orthogonal direction.

9. The semiconductor range-finding element according to claim 1, wherein a thickness of an insulating film formed on each of the first and second transfer channels is 150 nm or more and 1000 nm or less, in terms of a dielectric constant of a thermally oxidized film.

10. The semiconductor range-finding element according to claim 1, further comprising:
a first exhausting gate electrode configured to electrostatically control a potential of a first exhausting channel implemented by the same semiconductor region as the charge generation region through an insulating film formed on the first exhausting channel and configured to exhaust background charges generated in the charge generation region by receiving background light; and
a first exhausting drain region configured to receive the background charges exhausted by the first exhausting gate electrode, wherein, control pulse signals are sequentially applied to the first gate electrode, the second transfer gate electrode and the first exhausting gate electrode, in synchronization with the optical pulse, so as to operate the first and second transfer gate electrodes.

11. The semiconductor range-finding element according to claim 10, wherein a pulse width of the control pulse signal applied to the first exhausting gate electrode is longer than pulse widths of the control pulse signals applied to the first and second transfer gate electrodes.

12. The semiconductor range-finding element according to claim 10, further comprising:
a second exhausting gate electrode, which is opposite to the first exhausting gate electrode in a direction orthogonal to a transfer direction of the signal charges, configured to electrostatically control a potential of a second exhausting channel implemented by the same semiconductor region as the charge generation region, through an insulating film formed on the second exhausting channel, and configured to exhaust the background charges in a direction opposite to the background charges running through the first exhausting channel; and
a second exhausting drain region configured to receive the background charges exhausted by the second exhausting gate electrode.

13. A solid-state imaging device, having a plurality of pixels arrayed in a one-dimensional direction, wherein each of the pixels comprises:
a semiconductor photoelectric conversion element comprising:
a charge generation region of a first conductivity type, and
a part of a surface buried region of a second conductivity type of an opposite conductivity type to the first conductivity type on the charge generation region, configured to receive an optical pulse, which is reflected by a target sample, and to convert the optical pulse into signal charges in the charge generation region;
first and second transfer gate electrodes configured to electrostatically control potentials of first and second transfer channels implemented by another part of the surface buried region adjacent to the part of the surface buried region directly over the charge generation region, through insulating films formed on the first and second transfer channels, respectively, and configured to alternately transfer the signal charges through the first and second transfer channels; and
first and second floating drain regions configured to accumulate the signal charges transferred by the first and second transfer gate electrodes, sequentially and respectively, having the second conductivity type and a higher impurity concentration than the surface buried region,
wherein pulse signals are sequentially applied to the first and second transfer gate electrodes in all of the pixels, in synchronization with the optical pulse, and
in each of the pixels, a range to the target sample is measured in accordance with a distribution ratio between the charges accumulated in the first and second floating drain regions.

14. A solid-state imaging device, having a plurality of pixels arrayed in a shape of a two-dimensional matrix, wherein each of the pixels comprises:
a semiconductor photoelectric conversion element comprising:
a charge generation region of a first conductivity type, and a part of a surface buried region of a second conductivity type of an opposite conductivity type to the first conductivity type on the charge generation region,
configured to receive an optical pulse, which is reflected by a target sample, and to convert the optical pulse into signal charges in the charge generation region;
first and second transfer gate electrodes configured to electrostatically control potentials of first and second transfer channels implemented by another part of the surface buried region adjacent to a part of the surface buried region directly over the charge generation region, through insulating films formed on the first and second transfer channels, respectively, and configured to alternately transfer the signal charges through the first and second transfer channels; and
first and second floating drain regions configured to accumulate the signal charges transferred by the first and second transfer gate electrodes, sequentially and respectively, having the second conductivity type and a higher impurity concentration than the surface buried region,
wherein pulse signals are sequentially applied to the first and second transfer gate electrodes in all of the pixels, in synchronization with the optical pulse, and
in each of the pixels, a range to the target sample is measured in accordance with a distribution ratio between the charges accumulated in the first and second floating drain regions, and all of the pixels are two-dimensionally accessed, and a two-dimensional picture corresponding to the measured ranges is obtained.

15. The solid-state imaging device according to claim 14, wherein the charge generation region has the first conductivity type and is implemented by a part of a semiconductor layer provided on a semiconductor substrate, the semiconductor substrate having a higher impurity concentration than the charge generation region.

16. The solid-state imaging device according to claim 13, wherein the charge generation region has the first conductivity type and is implemented by a part of an epitaxial growth layer grown on a semiconductor substrate, the semiconductor substrate having a higher impurity concentration than the charge generation region.

17. The solid-state imaging device according to claim 15, wherein:
the semiconductor substrate has an impurity concentration of $4\times10^{17}$ cm$^{-3}$ or more and $1\times10^{21}$ cm$^{-3}$ or less; and
the charge generation region has an impurity concentration of $6\times10^{11}$ cm$^{-3}$ or more and $2\times10^{15}$ cm$^{-3}$ or less.

18. The solid-state imaging device according to claim 15, wherein:
the semiconductor substrate is a silicon substrate having an impurity concentration of $4\times10^{17}$ cm$^{-3}$ or more and $1\times10^{21}$ cm$^{-3}$ or less; and
the charge generation region is a silicon epitaxial growth layer having an impurity concentration of $6\times10^{11}$ cm$^{-3}$ or more and $2\times10^{15}$ cm$^{-3}$ or less.

19. The solid-state imaging device according to claim 13, wherein the semiconductor photoelectric conversion element further comprises:
a part of the insulating films extending to a site on the surface buried region, the site allocated directly over the charge generation region; and
a light-receiving gate electrode on an insulating film, directly over the charge generation region.

20. The solid-state imaging device according to claim 19, wherein the signal charges are transferred to directions opposite to each other, on a planar pattern, and respective central lines of the first transfer gate electrode and the second transfer gate electrode are aligned on a same straight line.

21. The solid-state imaging device according to claim 20, wherein respective widths of the first and second transfer gate electrodes measured in a direction orthogonal to a transfer direction of the signal charges are narrower than a width of the light-receiving gate electrode measured in the orthogonal direction.

22. The solid-state imaging device according to claim 1, wherein a thickness of an insulating film formed on each of the first and second transfer channels is 150 nm or more and 1000 nm or less, in terms of a dielectric constant of a thermally oxidized film.

23. The solid-state imaging device according to claim 13, wherein:
the insulating films are an oxide film formed by a step of forming a field oxide film of a CMOS integrated circuit; and
the semiconductor photoelectric conversion element, the first transfer gate electrode, the second transfer gate electrode, the first floating drain region and the second floating drain region are formed as steps for manufacturing the CMOS integrated circuit.

24. The solid-state imaging device according to claim 13, wherein the pixel is connected to each of the first and second floating drain regions and further comprises a voltage-readout buffer configured to read the charges accumulated in each of the first and second floating drain regions.

25. The solid-state imaging device according to claim 13, wherein the pixel further comprises:
a first reset gate electrode adjacent to the first floating drain region on a planar pattern;
a first reset source region opposite to the first floating drain region, with respect to the first reset gate electrode;
a second reset gate electrode adjacent to the second floating drain region on the planar pattern; and
a second reset source region opposite to the second floating drain region, with respect to the second reset gate electrode,
wherein, the charges accumulated in the first and second floating drain regions by applying a reset signal to the first and second reset gate electrodes are discharged to the first and second reset source regions, respectively, and the first and second floating drain regions are reset.

26. The solid-state imaging device according to claim 13, further comprising:
a first exhausting gate electrode configured to electrostatically control a potential of a first exhausting channel implemented by the same semiconductor region as the charge generation region through an insulating film formed on the first exhausting channel and configured to exhaust background charges generated in the charge generation region by receiving background light; and
a first exhausting drain region configured to receive the background charges exhausted by the first exhausting gate electrode,
wherein, control pulse signals are sequentially applied to the first gate electrode, the second transfer gate electrode and the first exhausting gate electrode, in synchronization with the optical pulse so as to operate the first gate electrode, the second transfer gate electrode and the first exhausting gate electrode.

27. The solid-state imaging device according to claim 26, wherein a pulse width of the control pulse signal applied to the first exhausting gate electrode is longer than pulse widths of the control pulse signals applied to the first and second transfer gate electrodes.

28. The solid-state imaging device according to claim 26, further comprising:

a second exhausting gate electrode, which is opposite to the first exhausting gate electrode in a direction orthogonal to a transfer direction of the signal charges, configured to electrostatically control a potential of a second exhausting channel implemented by the same semiconductor region as the charge generation region, through an insulating film formed on the second exhausting channel, and configured to exhaust the background charges in a direction opposite to the background charges running through the first exhausting channel; and a second exhausting drain region configured to receive the background charges exhausted by the second exhausting gate electrode.

* * * * *